US010378701B2

(12) United States Patent
Abe et al.

(10) Patent No.: US 10,378,701 B2
(45) Date of Patent: Aug. 13, 2019

(54) LIGHT EMITTING DEVICE

(71) Applicant: Panasonic Intellectual Property Management Co., Ltd., Osaka (JP)

(72) Inventors: Takeshi Abe, Osaka (JP); Shozo Oshio, Osaka (JP); Hiroshi Asano, Osaka (JP); Yosuke Honda, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/761,944

(22) PCT Filed: Oct. 26, 2016

(86) PCT No.: PCT/JP2016/004696
§ 371 (c)(1),
(2) Date: Mar. 21, 2018

(87) PCT Pub. No.: WO2017/073054
PCT Pub. Date: May 4, 2017

(65) Prior Publication Data
US 2018/0274737 A1    Sep. 27, 2018

(30) Foreign Application Priority Data

Oct. 28, 2015  (JP) .................. 2015-211962

(51) Int. Cl.
*F21K 9/64*        (2016.01)
*F21V 9/30*        (2018.01)
(Continued)

(52) U.S. Cl.
CPC .................. *F21K 9/64* (2016.08); *F21V 9/30* (2018.02); *F21V 9/32* (2018.02); *F21V 9/38* (2018.02); *F21Y 2115/30* (2016.08); *H01S 5/005* (2013.01)

(58) Field of Classification Search
CPC ..... F21K 9/64; F21K 9/61; F21V 9/38; F21V 9/32; F21V 9/30; F21S 2/00; H01S 5/005; H01L 33/504; F21Y 2115/30
See application file for complete search history.

(56) References Cited

U.S. PATENT DOCUMENTS

2005/0236971 A1    10/2005  Mueller-Mach
2008/0089089 A1*   4/2008   Hama ................. A61B 1/0653
                                                   362/574

(Continued)

FOREIGN PATENT DOCUMENTS

EP    2767756 A       8/2014
JP    2000-31531      1/2000

(Continued)

OTHER PUBLICATIONS

International Search Report (ISR) and Written Opinion dated Dec. 6, 2016 in International (PCT) Application No. PCT/JP2016/004696.

(Continued)

*Primary Examiner* — Kevin Quarterman
(74) *Attorney, Agent, or Firm* — Renner, Otto, Boisselle & Sklar, LLP

(57) ABSTRACT

A light emitting device includes a first wavelength converter that contains a first phosphor that absorbs at least part of primary light radiated by a radiation source and converts the primary light absorbed into secondary light, and a second wavelength converter that contains a second phosphor that absorbs at least part of the secondary light and converts the secondary light absorbed into tertiary light. The lifetime of fluorescence emitted from the second phosphor is longer than the lifetime of fluorescence emitted from the first phosphor, and the light density of the secondary light, with which the second wavelength converter is irradiated, is (Continued)

lower than the light density of the primary light, with which the first wavelength converter is irradiated.

19 Claims, 11 Drawing Sheets

(51) Int. Cl.
*F21V 9/32* (2018.01)
*F21V 9/38* (2018.01)
*F21Y 115/30* (2016.01)
*H01S 5/00* (2006.01)

(56) References Cited

U.S. PATENT DOCUMENTS

| | | |
|---|---|---|
| 2010/0254153 A1 | 10/2010 | Hama |
| 2013/0215598 A1 | 8/2013 | Guzan |
| 2014/0211169 A1 | 7/2014 | Kitano |
| 2015/0002824 A1 | 1/2015 | Kasugai |
| 2015/0153010 A1 | 6/2015 | Okuyama |
| 2015/0226389 A1 | 8/2015 | Kasugai |
| 2016/0327244 A1 | 11/2016 | Annen |

FOREIGN PATENT DOCUMENTS

| | | |
|---|---|---|
| JP | 2005-311373 | 11/2005 |
| JP | 2008-258177 | 10/2008 |
| JP | 2009-76656 | 4/2009 |
| JP | 5427324 | 12/2013 |
| JP | 2014-3070 | 1/2014 |
| JP | 2014-160227 | 9/2014 |
| JP | 2015-60969 | 3/2015 |
| WO | 2014/073136 | 5/2014 |
| WO | 2015/098258 | 7/2015 |

OTHER PUBLICATIONS

International Preliminary Report on Patentability (IPRP) dated Aug. 29, 2017 in International (PCT) Application No. PCT/JP2016/004696.

Applicant's Reply to Written Opinion dated Dec. 6, 2016 in International (PCT) Application No. PCT/JP2016/004696 (with English translation).

Extended European Search Report dated Nov. 16, 2018 issued for the corresponding EP patent application No. 16 859 292.1.

* cited by examiner

LIGHT EMITTING DEVICE

TECHNICAL FIELD

The present invention relates to a light emitting device.

BACKGROUND ART

In recent years, a light emitting device that is a combination of a solid-state light emitting element that emits laser light and a wavelength converter containing a phosphor has been proposed. There is a light emitting device formed of a solid-state light emitting element and a phosphor combined with each other with the wavelength or spectrum of the emitted light changed to a desired wavelength in accordance with the application.

When the phosphor is excited with the laser light having high light density, however, the phosphor experiences efficiency saturation, and the conversion efficiency of the phosphor therefore greatly falls. Therefore, undesirably, the power of the light emitting device cannot be sufficiently increased. For example, PTL 1 describes that a red phosphor tends to experience the efficiency saturation.

To address the problem described above, PTL 2 proposes a configuration in which light emitted from a semiconductor element is diffused by an optical lens and then applied to a wavelength converter containing a red phosphor for reduction in the light density of the light applied to the wavelength converter.

CITATION LIST

Patent Literature

PTL 1: Japanese Unexamined Patent Application Publication No. 2014-160227
PTL 2: International Publication No. 2014/073136

SUMMARY OF THE INVENTION

Technical Problem

However, incorporating the optical lens or any other optical part in the device leads to a complicated configuration and undesirably makes it difficult to provide a compact light emitting device.

The present invention provides a compact light emitting device.

Solution to Problem

An aspect of a light emitting device according to the present invention relates to a light emitting device including a radiation source that radiates laser light as primary light, a first wavelength converter that contains a first phosphor that absorbs at least part of the primary light radiated by the radiation source and converts the primary light absorbed into secondary light, and a second wavelength converter that contains a second phosphor that absorbs at least part of the secondary light emitted by the first wavelength converter and converts the secondary light absorbed into tertiary light. The light emitting device emits output light containing the primary light, the secondary light, and the tertiary light. The secondary light contains a larger amount of long-wavelength component than the primary light, and the tertiary light contains a larger amount of long-wavelength component than the secondary light. A lifetime of fluorescence emitted from the second phosphor is longer than a lifetime of fluorescence emitted from the first phosphor. Light density of the secondary light, with which the second wavelength converter is irradiated, is lower than light density of the primary light, with which the first wavelength converter is irradiated.

Advantageous Effect of Invention

According to the present invention, a compact light emitting device is achieved.

DESCRIPTION OF EXEMPLARY EMBODIMENTS

Figure 1:
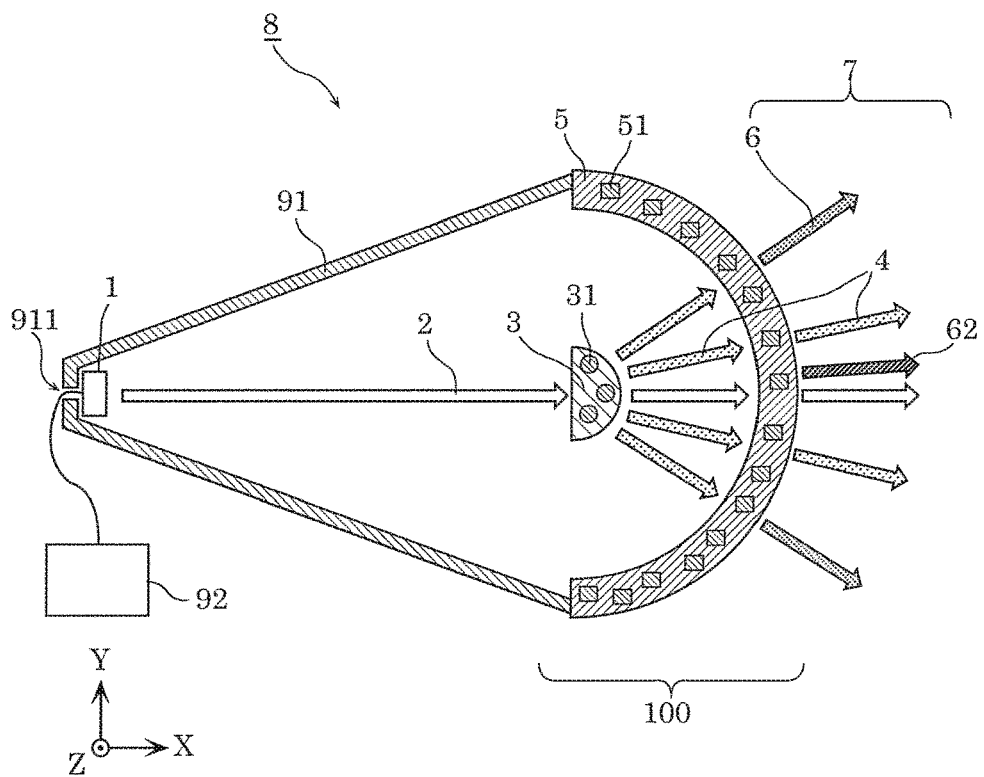
FIG. 1 is a schematic view showing the configuration of a light emitting device according to a first embodiment.

Embodiments of the present invention will be described below with reference to the drawings. The embodiments described below each show a preferable specific example of the present invention. The numerals, shapes, materials, components, arrangements of the components, and connection forms between the components shown in the following embodiments are therefore presented by way of example and are not intended to limit the present invention. Therefore, out of the components in the following embodiments, a component that is not described in the independent claims, which each represent the highest-level concept of the present invention, is described as an arbitrary component.

The drawings are diagrammatic views and are not necessarily exactly drawn. Further, in the drawings, substantially the same configurations have the same reference character, and redundant description thereof is omitted or simplified.

(First Embodiment)

[Schematic Configuration]

The configuration of a light emitting device according to a first embodiment will first be described with reference to FIG. 1. FIG. 1 shows the configuration of the light emitting device according to the first embodiment.

Light emitting device 8 according to the first embodiment includes radiation source 1, first wavelength converter 3, and second wavelength converter 5, as shown in FIG. 1.

Radiation source 1 radiates laser light as primary light 2. First wavelength converter 3 includes first phosphor 31 that absorbs at least part of primary light 2 and converts absorbed primary light 2 into secondary light 4. Second wavelength converter 5 includes second phosphor 51 that absorbs at least part of secondary light 4 emitted from first wavelength converter 3 and converts absorbed secondary light 4 into tertiary light 6. Light emitting device 8 emits output light 7 containing primary light 2, secondary light 4, and tertiary light 6. The lifetime of fluorescence emitted from second phosphor 51 is longer than the lifetime of the fluorescence emitted from first phosphor 31.

In the first embodiment, light emitting device 8 has an outer shell that is the combination of roughly conical cover 91 and roughly hemispherical second wavelength converter 5 with second wavelength converter 5 forming the bottom of cover 91. Radiation source 1 is located in the vicinity of the vertex of roughly conical cover 91, and primary light 2 radiated by radiation source 1 has an optical axis roughly parallel to the axis of roughly conical cover 91 (axis of cone). Radiation source 1 is connected, for example, to external power supply 92, which supplies radiation source 1 with electric power. In light emitting device 8, first wavelength converter 3 is located between radiation source 1 and second wavelength converter 5 and separate from both radiation source 1 and second wavelength converter 5.

In the drawings, the direction of the optical axis of primary light 2 is called an x-axis direction. The directions perpendicular to each other in a plane perpendicular to the x axis are called a y-axis direction and a z-axis direction.

In the first embodiment, for example, the length of light emitting device 8 in the x-axis direction is 200 mm or smaller, and the radius of the bottom of roughly conical cover 91 is 50 mm or smaller. The length of light emitter 100, which is formed of first wavelength converter 3 and second wavelength converter 5, in the x-axis direction is smaller than or equal to 50 mm, and the radius of roughly hemispherical second wavelength converter 5 is smaller than or equal to 50 mm.

A detailed configuration of light emitting device 8 will be described below with reference continuously to FIG. 1.

[Radiation Source]

Radiation source 1 radiates laser light as primary light 2. Thus functioning radiation source 1 is, for example, a laser diode, such as a surface emitting laser diode. Radiation source 1 is accommodated in cover 91 and connected to external power supply 92 via a power supply line passing through through hole 911 of cover 91.

Radiation source 1 includes, for example, a solid-state light emitting element, such as the laser diode described above. The configuration described above makes the size of radiation source 1 small and therefore allows reduction in size of light emitting device 8.

Radiation source 1 radiates, as primary light 2, blue light having an emission spectrum showing a maximum peak intensity in a region having, for example, a wavelength of at least 420 nm and at most 480 nm or a wavelength of at least 440 nm and at most 470 nm. Primary light 2, the maximum peak intensity of which occurs in the region having the wavelength described above, is readily visually recognizable blue light. Primary light 2 can therefore be used without waste not only as excitation light that excites first phosphor 31 and second phosphor 51 but as output light 7 from light emitting device 8.

Radiation source 1 may instead radiate, as primary light 2, ultraviolet light having an emission spectrum showing a maximum peak intensity in a region having, for example, a wavelength of at least 200 nm and at most 380 nm or a wavelength of at least 360 nm and at most 380 nm. Radiation source 1 may still instead radiate, as primary light 2, light based on violet and having an emission spectrum showing a maximum peak intensity in a region having, for example, a wavelength of at least 380 nm and at most 420 nm or a wavelength of at least 395 nm and at most 415 nm.

In the case where primary light 2 has a maximum peak intensity in the ultraviolet or violet-based wavelength region as described above, blue phosphor can be selected as first phosphor 31. Using blue phosphor as first phosphor 31 allows blue light emitted from first phosphor 31 and having a broad emission spectrum to be used as part of output light 7. In general, the spectrum of the light emitted from a phosphor has a broader spectrum width (FWHM: full width at half maximum) than that of the emission spectrum of laser light. The configuration described above can achieve output light 7 having high color rendering properties.

Primary light 2 may still instead be high-light-density light that is the laser light radiated by radiation source 1 and focused into a spot in the vicinity of first wavelength converter 3.

[First Wavelength Converter]

First wavelength converter 3 is irradiated with primary light 2 from radiation source 1. That is, first wavelength converter 3 is irradiated with primary light 2 that keeps the high light density. No optical element or any other component may be disposed between radiation source 1 and first wavelength converter 3 but first wavelength converter 3 may be directly irradiated with primary light 2 radiated by radiation source 1. Instead, a light collection lens, an optical fiber or any other optical waveguide, an optical filter, a flat-surface reflection mirror, a polarizer, or any other optical element may be disposed between radiation source 1 and first wavelength converter 3. In this case, primary light 2 passes through these optical elements, and then first wavelength converter 3 is irradiated with primary light 2 that keeps the high light density.

First wavelength converter 3 contains first phosphor 31. In the first embodiment, first wavelength converter 3 contains a plurality of first phosphors 31 of one kind. First wavelength converter 3 is formed by sealing the plurality of first phosphors 31 in a sealing material. First wavelength converter 3 may contain a plurality of kinds of first phosphors 31.

First wavelength converter 3 (first phosphors 31) absorbs at least part of primary light 2 and converts absorbed primary light 2 into secondary light 4. Second wavelength converter 5 is irradiated with secondary light 4 emitted from first wavelength converter 3. The light density of primary light 2, with which first wavelength converter 3 is irradiated, is higher than the light density of secondary light 4, with which second wavelength converter 5 is irradiated. Specifically, the angle of radiation of secondary light 4, which is primarily formed of fluorescence from first phosphors 31, is greater than the angle of radiation of primary light 2, which is laser light. Therefore, in the first embodiment, the light density of secondary light 4, with which second wavelength converter 5 is irradiated is lower than the light density of primary light 2, with which first wavelength converter 3 is irradiated.

First wavelength converter 3 scatters or transmits at least part of primary light 2 and outputs scattered or transmitted primary light 2 as part of output light 7.

[First Phosphors]

First phosphors 31 are contained in first wavelength converter 3. First phosphors 31 absorb primary light 2 as the excitation light and emit secondary light 4 in the form of fluorescence. Secondary light 4 emitted by first phosphors 31 has a larger amount of long-wavelength component than primary light 2, which is the excitation light that excites first phosphors 31. For example, the emission peak wavelength of secondary light 4 is longer than the emission peak wavelength of primary light 2.

In the first embodiment, the lifetime of fluorescence emitted from first phosphors 31 is shorter than the lifetime of the fluorescence emitted from second phosphors 51. That is, a phosphor having a relatively short fluorescence lifetime is used as first phosphors 31. For example, first phosphors 31 are each a phosphor that undergoes parity-allowed-transition-type light emission. First phosphors 31 are each specifically, for example, an $Eu^{2+}$ activated phosphor or a $Ce^{3+}$ activated phosphor.

For example, a $Ce^{3+}$ activated phosphor is an ultrashort-afterglow phosphor that emits fluorescence having a fluorescence lifetime longer than or equal to 10 ns but shorter than or equal to 100 ns and is a phosphor that is most unlikely to experience a decrease in light emission efficiency under excitation with high light density. Therefore, when a $Ce^{3+}$ activated phosphor is used as each of first phosphors 31, first phosphors 31 experiences a small amount of efficiency saturation even when first phosphors 31 are excited with high-light-density primary light 2, which is laser light.

In general, the fluorescence lifetime varies in accordance with an activator. For example, the lifetime of fluorescence emitted from a $Ce^{3+}$ activated phosphor is shorter than the lifetime of fluorescence emitted from an $Eu^{2+}$ activated phosphor, and the lifetime of fluorescence emitted from an $Eu^{2+}$ activated phosphor is shorter than the lifetimes of fluorescence emitted from a $Tb^{3+}$ activated phosphor, an $Mn^{2+}$ activated phosphor, and an $Mn^{4+}$ activated phosphor. First phosphors 31 and second phosphors 51 are selected as appropriate based, for example, on these fluorescence lifetimes according to an activator in such a way that the lifetime of fluorescence emitted from second phosphors 51 is longer than the lifetime of fluorescence emitted from first phosphors 31.

First phosphors 31 emit, for example, visible light. When secondary light 4 emitted from first phosphors 31 contains visible light, which is visible to a human eye, secondary light 4 can be used as illumination light.

The fluorescence emitted by first phosphors 31 has a spectrum showing a maximum peak intensity in a region having, for example, a wavelength of at least 480 nm and at most 600 nm, a wavelength of at least 525 nm and at most 585 nm, or a wavelength of at least 535 nm and at most 575 nm. In this case, secondary light 4 emitted from first phosphors 31 is visible light having high luminous efficacy, whereby high-luminous-flux light emitting device 8 is achieved by using secondary light 4 as illumination light.

In the case where first phosphors 31 are each a $Ce^{3+}$ activated phosphor, fluorescence emitted by first phosphors 31 has a spectrum showing a maximum peak intensity in a region having, for example, a wavelength of at least 500 nm and at most 560 nm, a wavelength of at least 510 nm and at most 550 nm, or a wavelength of at least 520 nm and at most 540 nm. In this case, secondary light 4 emitted from first phosphors 31 is high-power visible light having a small degree of temperature quenching, whereby high-luminous-flux light emitting device 8 is achieved by using secondary light 4 as illumination light.

First phosphors 31 each have, for example, a garnet structure. The garnet structure is generally expressed by a general formula $A'_3B'_2(C'X_4)_3$. In the general formula, A', B', and C' each represent a metal element that can form the garnet structure, and X represents a nonmetal element that can form the garnet structure.

The metal element A' is, for example, at least one element selected from alkali metals, alkaline earth metals, magnesium, rare earths, and transition metals. The metal element A' is specifically at least one element selected, for example, from Na, K, Rb, Cs, Mg, Ca, Sr, Ba, Y, Ln, and Mn (Ln represents lanthanoid having atomic numbers ranging from 57 to 71).

The metal element B' is, for example, at least one element selected from rare earths, transition metals, alkaline earth metals, magnesium, and carbon-family elements. The metal element B' is specifically at least one element selected, for example, from Mg, Sc, Y, Lu, Ti, Zr, Hf, V, Cr, Nb, Fe, Co, Ni, Cu, Zn, Al, Ga, In, and Sn.

The metal element C' is, for example, at least one element selected from alkali metals, transition metals, alkaline earth metals, magnesium, carbon-family elements, and nitrogen-family elements. The metal element C' is specifically at least one element selected, for example, from Li, V, Fe, Al, Ga, Si, Ge, and P.

The nonmetal element X is, for example, at least one element selected from nitrogen, chalcogen, and halogen. The nonmetal element X is specifically at least one element selected, for example, from N, O, F, and Cl.

A $Ce^{3+}$ activated phosphor having the garnet structure is, for example, any of the following phosphors:

A cyan $Ce^{3+}$ activated phosphor having the garnet structure is, for example, $Ca_2YZr_2(AlO_4)_3:Ce^{3+}$. The cyan $Ce^{3+}$ activated phosphor is a $Ce^{3+}$ activated phosphor that emits light having an emission peak in a region having a wavelength of at least 480 nm and at most 500 nm.

A green $Ce^{3+}$ activated phosphor having the garnet structure is, for example, $Lu_3Al_2(AlO_4)_3:Ce^{3+}$, $Lu_3(Al,Ga)_2(AlO_4)_3:Ce^{3+}$, $(Y,Lu)_3Al_2(AlO_4)_3:Ce^{3+}$, $Y_3Al_2(AlO_4)_3:Ce^{3+}$, $Y_3Ga_2(AlO_4)_3:Ce^{3+}$, or $Ca_3Sc_2(SiO_4)_3:Ce^{3+}$. The green $Ce^{3+}$ activated phosphor is a $Ce^{3+}$ activated phosphor that emits light having an emission peak in a region having a wavelength of at least 500 nm and at most 560 nm, in particular, at least 510 nm and at most 550 nm.

Out of the green $Ce^{3+}$ activated phosphors described above, $Lu_3Al_2(AlO_4)_3:Ce^{3+}$ and $Lu_3(Al,Ga)_2(AlO_4)_3:Ce^{3+}$ each have a small degree of temperature quenching as compared with $Y_3Ga_2(AlO_4)_3:Ce^{3+}$ and therefore hold a high efficiency level even when the temperature of the phosphor is increased by the primary light in the high-light-density excitation. Using $Lu_3Al_2(AlO_4)_3:Ce^{3+}$ activated green phosphor allows light emitting device 8 to output the green light components at increased efficiency. $Lu_3Al_2(AlO_4)_3:Ce^{3+}$ is therefore useful as a phosphor for illumination purposes.

A yellowish-green-to-yellow-to-orange $Ce^{3+}$ activated phosphor having the garnet structure is, for example, $(Y,Gd)_3Al_2(AlO_4)_3:Ce^{3+}$. The yellowish-green-to-yellow-to-orange $Ce^{3+}$ activated phosphor is a $Ce^{3+}$ activated phosphor that emits light having an emission peak in a region having a wavelength of at least 560 nm and at most 600 nm.

First phosphors 31 may instead be formed of at least one single crystal. In this case, first phosphors 31 each have a small number of internal defects, whereby light emitting device 8 in which first phosphors 31 cause only a small amount of wavelength conversion loss is achieved.

Still instead, first phosphors 31 may be formed of a plurality of single crystals and may be contained in first wavelength converter 3. Primary light 2, which is laser light, is therefore diffused in first wavelength converter 3. As a result, the light with which second wavelength converter 5 is irradiated has low density, whereby high-power light emitting device 8 in which efficiency saturation of second phosphors 51 contained in second wavelength converter 5 is further suppressed is achieved.

[Second Wavelength Converter]

Second wavelength converter 5 is irradiated with secondary light 4 from first wavelength converter 3. In the first embodiment, the thickness of second wavelength converter 5 is, for example, greater than or equal to 10 μm but smaller than 10 mm. Second wavelength converter 5 is, for example, a film-shaped or thick-membrane-shaped wavelength converter and is so formed as to have a hemispherical shape that surrounds first wavelength converter 3, as shown in FIG. 1.

Second wavelength converter 5 contains second phosphors 51. In the first embodiment, second wavelength converter 5 contains a plurality of second phosphors 51 of one kind. Second wavelength converter 5 is formed by sealing the plurality of second phosphors 51 in a sealing material. Second wavelength converter 5 may contain a plurality of kinds of second phosphors 51.

Second wavelength converter 5 (second phosphors 51) absorbs at least part of secondary light 4 and converts absorbed secondary light 4 into tertiary light 6. Second wavelength converter 5 (second phosphors 51) absorbs at least part of primary light 2 having been scattered by first wavelength converter 3 or having passed through first wavelength converter 3 to emit fluorescence 62. Primary light 2, with which second wavelength converter 5 is irradiated, is partially scattered or absorbed by first wavelength converter 3 before reaching second wavelength converter 5. The light density of primary light 2 with which second wavelength converter 5 is irradiated is therefore lower than the light density of primary light 2 with which first wavelength converter 3 is irradiated.

Second wavelength converter 5 scatters or transmits at least part of primary light 2 and secondary light 4 having been scattered by first wavelength converter 3 or having passed through first wavelength converter 3 and outputs scattered or transmitted primary light 2 and secondary light 4 as part of output light 7.

[Second Phosphors]

Second phosphors 51 are contained in second wavelength converter 5. Second phosphors 51 are each a phosphor that emits a light component having a wavelength longer than the wavelength of the light emitted from first phosphors 31, absorb at least part of secondary light 4 as the excitation light, and emit tertiary light 6 in the form of fluorescence. Second phosphors 51 absorb, as the excitation light, at least part of primary light 2 having been scattered by first wavelength converter 3 or having passed through first wavelength converter 3 to emit fluorescence 62. Tertiary light 6, which is the fluorescence from second phosphors 51, has a larger amount of long wavelength component than secondary light 4, which is the excitation light that excites second phosphors 51. For example, the emission peak wavelength of tertiary light 6 is longer than the emission wavelength of secondary light 4.

Since second phosphors 51 emit a light component having an emission spectrum that cannot be achieved only by first phosphors 31 as described above, a light emitting device that readily controls the spectrum of output light 7 is achieved. Further, since second phosphors 51 absorb, as the excitation light, at least part of low-light-density primary light 2, which has been scattered by first wavelength converter 3 or having passed through first wavelength converter 3, and low-light-density secondary light 4, which has been emitted by first wavelength converter 3, the efficiency saturation is unlikely to occur.

Second phosphors 51 are each a phosphor activated, for example, by a transition metal ion or a rare earth ion. The transition meal ion described above is specifically at least one ion selected, for example, from $Ti^{4+}$, $Cr^{3+}$, $Mn^{2+}$, $Mn^{4+}$, and $Fe^{3+}$, and $Mn^{4+}$ is an representative example. The rare earth ion described above is at least one ion selected, for example, from $Ce^{3+}$, $Pr^{3+}$, $Nd^{3+}$, $Sm^{3+}$, $Eu^{2+}$, $Eu^{3+}$, $Tb^{3+}$, $Dy^{3+}$, $Ho^{3+}$, $Er^{3+}$, $Tm^{3+}$, and $Yb^{3+}$, and $Eu^{2+}$ is an representative example. The phosphor activated with $Mn^{4+}$ is, for example, $3.5MgO \cdot 0.5MgF_2 \cdot GeO_2:Mn^{4+}$ or any other oxide phosphor and $K_2SiF_6:Mn^{4+}$ or any other fluoride phosphor. Thus formed second phosphors 51 can absorb primary light 2 and efficiently convert primary light 2 into fluorescence 62 having a wavelength longer than that of primary light 2.

Second phosphors 51 may each be an $Eu^{2+}$ activated phosphor. The $Eu^{2+}$ activated phosphor is, for example, $Ca_2SiO_4:Eu^{2+}$, $(Ca,Sr,Ba)_3SiO_5:Eu^{2+}$, $CaS:Eu^{2+}$, and $NaMgPO_4:Eu^{2+}$. When second phosphors 51 are each an $Eu^{2+}$ activated phosphor, second phosphors 51 emit light having an emission spectrum having a narrow half width that cannot be achieved by a $Ce^{3+}$ activated phosphor, whereby light emitting device 8 that readily controls the spectrum of output light 7 can be achieved.

Second phosphors 51 may instead each be a nitride phosphor or an oxynitride phosphor. The nitride phosphor can, for example, be $Sr_2Si_5N_8:Eu^{2+}$, $CaAlSiN_3:Eu^{2+}$, $SrAlSi_4N_7:Eu^{2+}$, and $SrLiAl_3N_4:Eu^{2+}$. The oxynitride phosphor is, for example, $Sr_2(Si,Al)_5(N,O)_8:Eu^{2+}$, $CaAl(Si,Al)(N,O)_3:Eu^{2+}$, and $SrAl(Si,Al)_4(N,O)_7:Eu^{2+}$. When second phosphors 51 are each a nitride phosphor or an oxynitride phosphor, second phosphors 51 are chemically stable, have high excitation light absorptance, and can efficiently convert absorbed excitation light into light having a wavelength longer than the excitation light.

Second phosphors 51 may instead be a compound having the same crystal structure as that of $CaAlSiN_3$. Second phosphors 51 having the same crystal structure as that of $CaAlSiN_3$ are each a phosphor having been practically proved as a phosphor for LED illumination, whereby readily procurable second phosphors 51 can be used to achieve light emitting device 8 that outputs high-power, highly reliable output light.

Still instead, second phosphors 51 may have an intensity maximum value (emission peak) in a region having a wavelength of at least 600 nm and at most 660 nm or a wavelength of at least 620 nm and at most 650 nm. Using thus configured second phosphors 51 allows output light 7 from light emitting device 8 to contain a large amount of red component, whereby light emitting device 8 suitable for high-color-rendering illumination can be achieved.

[Sealing Structure]

First wavelength converter 3 is formed by sealing first phosphors 31 in a sealing material, and second wavelength converter 5 is formed by sealing second phosphors 51 in a sealing material.

Examples of the sealing structure may include a structure sealed with a resin material and a structure sealed with an inorganic material. The inorganic material described above also includes a light translucent fluorescent ceramic material and single crystal.

Examples of the resin material may include a silicone resin, a fluororesin, a silicone-epoxy hybrid resin, and a urea resin. In the case of the structure in which phosphors are sealed with a resin material, an orthodox resin sealing technology having been practically proved can be used, whereby the wavelength converter is readily designed.

The inorganic material means a material other than organic materials and includes a ceramic material and a metallic material. The inorganic material also includes an organic siloxane in which part of siloxane is replaced with an alkyl group or any other organic functional group. Other examples of the inorganic material may include a metal oxide, low-melting glass, and ultrafine particles.

A wavelength converter having the structure in which phosphors are sealed in an inorganic material has higher heat dissipation capability than a wavelength converter in which phosphors are sealed in an organic material and can therefore suppress an increase in the temperature of the phosphors when they are excited or otherwise processed. Therefore, in a wavelength converter having the structure in which phosphors are sealed in an inorganic material, the temperature quenching of the phosphors is suppressed, whereby light emitting device 8 can output high-power output light 7.

In the first embodiment, first wavelength converter 3 is formed by sealing first phosphors 31 in an inorganic material. In the case where first phosphors 31 are excited with high-light-density primary light 2, the temperature quenching of first phosphors 31 due to heat dissipation is suppressed because first phosphors 31 are sealed in an inorganic material, whereby light emitting device 8 can output high-power output light 7.

[Primary Light, Secondary Light, Tertiary Light, and Output Light]

The light density of secondary light 4, with which second wavelength converter 5 is irradiated, is, for example, less than or equal to 1/10 of the light density of primary light 2, with which first wavelength converter 3 is irradiated. The light density of the excitation light that excites second phosphors 51 is therefore lower than the light density of primary light 2, which is the laser light radiated from radiation source 1, at least by an order of magnitude, whereby the efficiency saturation of second phosphors 51 is unlikely to occur. That is, the conversion efficiency is increased in the wavelength conversion from secondary light 4 to tertiary light 6 in second wavelength converter 5, whereby light emitting device 8 that outputs increased-intensity tertiary light 6 can be achieved.

Output light 7 contains primary light 2 that has been outputted from radiation source 1 but has not been wavelength-converted in first wavelength converter 3 or second wavelength converter 5 and has exited out thereof, secondary light 4 that has been emitted from first wavelength converter 3 but has not been wavelength-converted in second wavelength converter 5 but has exited out thereof, and tertiary light 6 that has been emitted from second wavelength converter 5. Output light 7 may contain fluorescence 62 emitted from second wavelength converter 5 that absorbs at least part of primary light 2 having been scattered by first wavelength converter 3 or having passed through first wavelength converter 3. In this case, for example, the amount of primary light 2 which has passed through first wavelength converter 3 and with which second wavelength converter 5 is irradiated is smaller than the amount of secondary light 4 with which second wavelength converter 5 is irradiated by first wavelength converter 3.

Part of each of primary light 2, secondary light 4, and tertiary light 6 passes through first wavelength converter 3 and second wavelength converter 5. Further, part of each of primary light 2, secondary light 4, and tertiary light 6 is scattered in first wavelength converter 3 and second wavelength converter 5. Moreover, part of each of primary light 2, secondary light 4, and tertiary light 6 is absorbed, scattered, or reflected at the inner surface of cover 91.

The correlated color temperature of output light 7 is, for example, higher than or equal to 2,500K but lower than or equal to 7,000K. When the correlated color temperature of output light 7 from light emitting device 8 is higher than or equal to 2,500K but lower than or equal to 7,000K, light emitting device 8 that outputs light preferred as illumination light is achieved. Examples of a method for causing the correlated color temperature of output light 7 from light emitting device 8 to be higher than or equal to 2,500K but lower than or equal to 7,000K may include a method for selecting any of laser light sources used in radiation source 1 that emit light beams that belong to different wavelength regions and a method for adjusting the type or the amount of first phosphor 31 contained in first wavelength converter 3, second phosphor 51 contained in second wavelength converter 5, and other phosphors and pigments or adjusting the distribution of the phosphors in each of the wavelength converters.

Output light 7 is outputted, for example, from second wavelength converter 5. Light emitting device 8 therefore has a simple device configuration and is therefore readily designed. Output light 7 can be used as illumination light, as described above.

[Cover]

Light emitting device 8 has a structure having a closed space surrounded by cover 91 and second wavelength converter 5 in the first embodiment. Cover 91 has, for example, through hole 911, through which the power supply line of external power supply 92 is inserted, and is formed by injection molding using an ABS resin or any other resin material. The closed space surrounded by cover 91 and second wavelength converter 5 may be a vacuum space or may be filled with air, nitrogen, a rare gas, or a transparent resin or glass material.

In the case where the closed space surrounded by cover 91 and second wavelength converter 5 is a vacuum space or is filled with nitrogen, a rear gas, or any other substance, light emitting device 8 has a hermetic structure, for example, by hermetically closing through hole 911. In the case where the closed space surrounded by cover 91 and second wavelength converter 5 is filled with air or a transparent material, a gap or any other space may be present in the closed space surrounded by cover 91 and second wavelength converter 5.

In light emitting device 8 according to the first embodiment, first wavelength converter 3 containing first phosphors 31, which emit fluorescence having a short lifetime, is irradiated with primary light 2, and second wavelength converter 5 is irradiated with secondary light 4 emitted from first wavelength converter 3. In light emitting device 8, since second wavelength converter 5 (second phosphors 51), which is more likely to experience efficiency saturation than first wavelength converter 3 (first phosphors 31), is unlikely to be directly irradiated with high-power primary light 2, occurrence of the efficiency saturation is suppressed. Further, in light emitting device 8, since no optical part or any other component needs to be added to suppress the efficiency saturation, light emitting device 8 is allowed to have a compact configuration without a complicated device structure.

[Variation 1]

Figure 2:
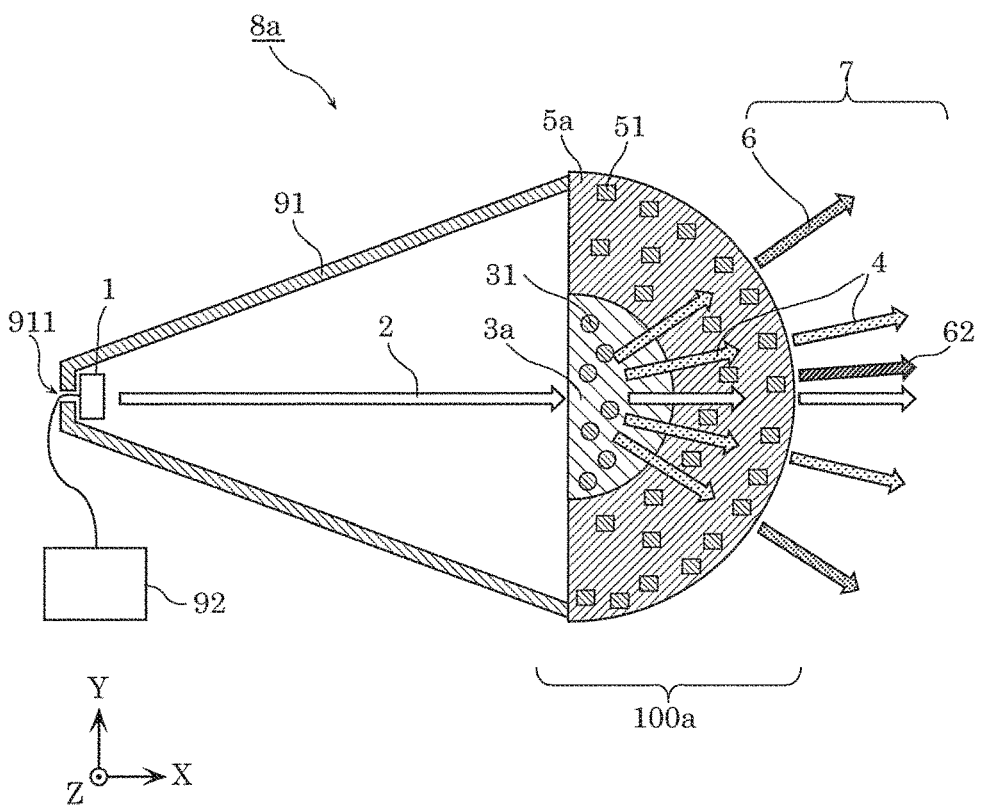
FIG. 2 is a schematic view showing the configuration of a light emitting device according to Variation 1 of the first embodiment.

The configuration of a light emitting device according to Variation 1 will next be described with reference to FIG. 2. FIG. 2 shows the configuration of the light emitting device according to Variation 1. The following description will be made primarily of differences between light emitting device 8a according to Variation 1 and light emitting device 8, and the same configurations as those of light emitting device 8 will not be described.

Light emitting device 8a according to Variation 1 includes light emitter 100a including first wavelength converter 3a and second wavelength converter 5a, as shown in FIG. 2. In light emitter 100a, first wavelength converter 3a and second wavelength converter 5a are physically in contact with each other. First wavelength converter 3a has, for example, a hemispherical shape having a radius smaller than or equal to 45 mm but greater than or equal to 20 mm. Second wavelength converter 5a is entirely in contact with the spherical surface of first wavelength converter 3a but may instead be partially in contact with the spherical surface of first wavelength converter 3a.

Second wavelength converter 5a is not a film-shaped or thick-membrane-shaped wavelength converter but has a certain thickness. The thickness of second wavelength converter 5a is, for example, greater than or equal to 5 mm but smaller than or equal to 30 mm. The ratio between the radius of first wavelength converter 3a and the thickness of second wavelength converter 5a may be changed as appropriate.

In the portion where first wavelength converter 3a and second wavelength converter 5a are physically in contact with each other, only one interface is present between first wavelength converter 3a and second wavelength converter 5a. Further, first wavelength converter 3a and second wavelength converter 5a are each made of a solid material, and the difference in refractive index therebetween is smaller than the difference between a gas and a solid.

On the other hand, in light emitting device 8, first wavelength converter 3 and second wavelength converter 5 are not physically in contact with each other, and a gas layer is present between first wavelength converter 3 and second wavelength converter 5, at least two interfaces are present therebetween. In the case where a gas layer is present between first wavelength converter 3 and second wavelength converter 5, the differences in refractive indices between first wavelength converter 3 and the gas layer and between second wavelength converter 5 and the gas layer have larger values.

That is, light emitting device 8a can reduce optical loss due to reflection resulting from the difference in refractive index in the process in which the light propagates from first wavelength converter 3a to second wavelength converter 5a, as compared with light emitting device 8. Light emitting device 8a can therefore output high-efficiency output light 7 with a smaller amount of optical loss.

When the light exiting surface of first wavelength converter 3a (surface facing output light 7) is entirely in physical contact with the light incident surface of second wavelength converter 5a (surface facing primary light 2), the optical loss due to reflection resulting from the difference in refractive index can be reduced as compared with the case where the light exiting surface of first wavelength converter 3a and the light incident surface of second wavelength converter 5a are partially in contact with each other.

[Variation 2]

Figure 3:
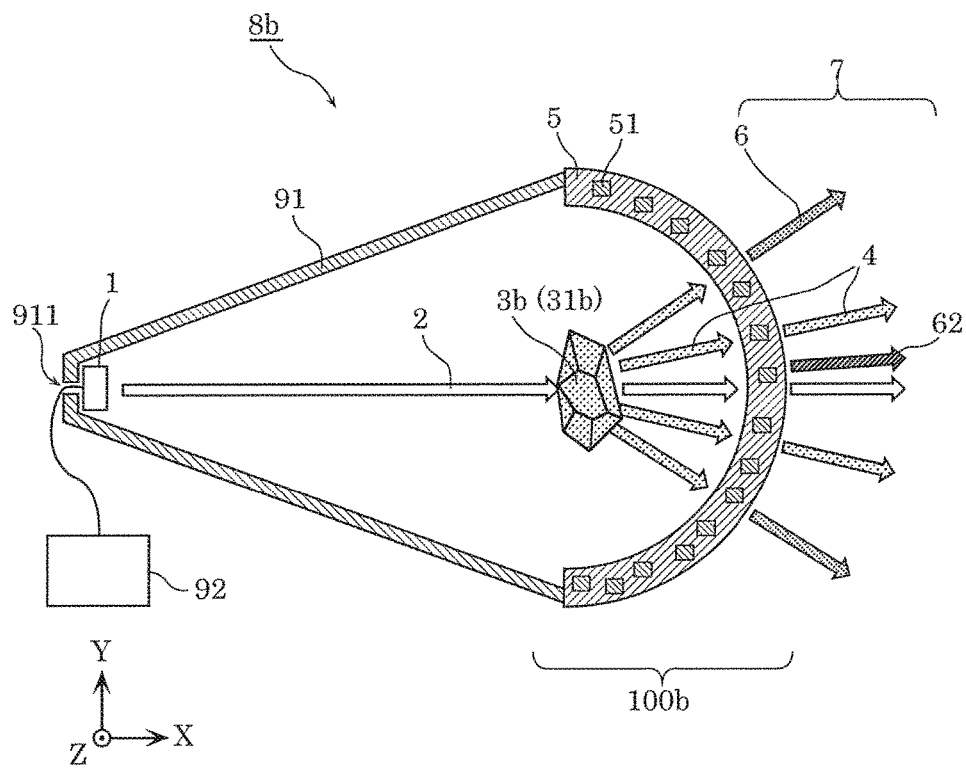
FIG. 3 is a schematic view showing the configuration of a light emitting device according to Variation 2 of the first embodiment.

The configuration of a light emitting device according to Variation 2 will next be described with reference to FIG. 3. FIG. 3 is a schematic view showing the configuration of the light emitting device according to Variation 2. The following description will be made primarily of differences between light emitting device 8b according to Variation 2 and light emitting device 8, and the same configurations as those of light emitting device 8 will not be described.

Light emitting device 8b according to Variation 2 includes light emitter 100b including first wavelength converter 3b (first phosphor 31b) and second wavelength converter 5, as shown in FIG. 3. First phosphor 31b is a single particle having a polyhedral particle shape derived from the garnet crystal structure. First wavelength converter 3b is formed only of the single particle (first phosphor 31b) having the polyhedral particle shape derived from the garnet crystal structure.

The "polyhedral particle shape derived from the garnet crystal structure" refers to a polyhedron or a shape close thereto. First wavelength converter 3b (first phosphor 31b) has a particle shape having, for example, plain facets. In general, a facet is a flat crystal surface in the atomic scale. A facet is seen in a single crystal that excels in crystal quality. A garnet compound formed of a single particle having a highly flat facet can be considered as a single-crystal particle that excels in crystal quality.

Thus configured first wavelength converter 3b (first phosphor 31b) is compact and excels in crystal quality. First wavelength converter 3b (first phosphor 31b) allows compact, high-power light emitting device 8b to be achieved.

[Variation 3]

Figure 4:
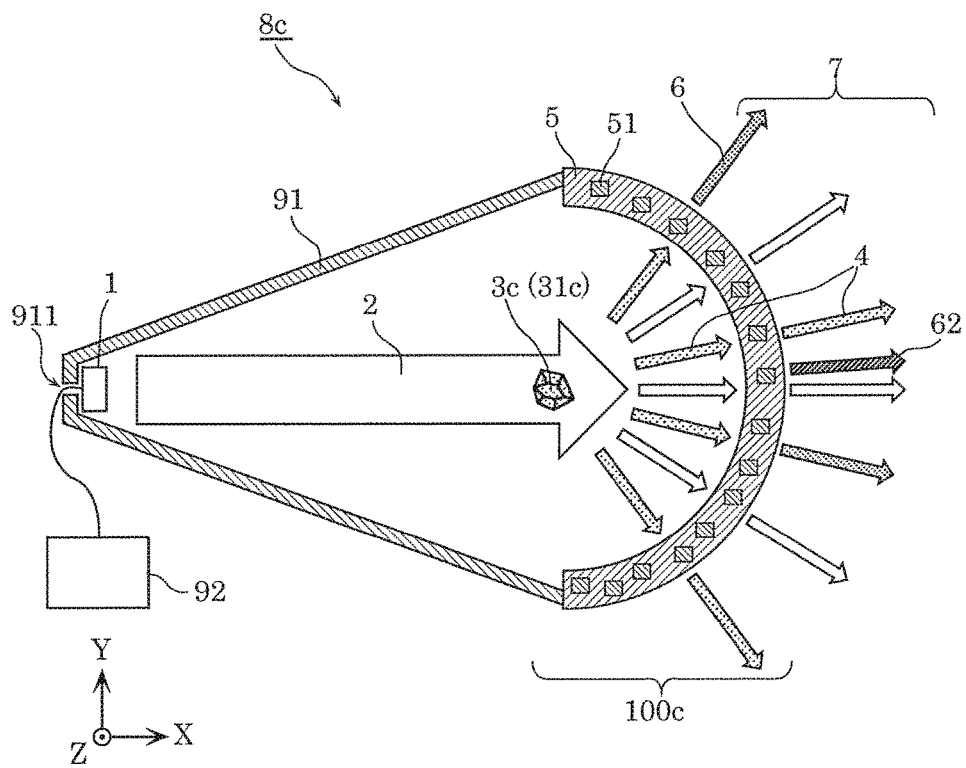
FIG. 4 is a schematic view showing the configuration of a light emitting device according to Variation 3 of the first embodiment.

The configuration of a light emitting device according to Variation 3 will next be described with reference to FIG. 4. FIG. 4 is a schematic view showing the configuration of the light emitting device according to Variation 3. The following description will be made primarily of differences between light emitting device 8c according to Variation 3 and light emitting device 8b according to Variation 2, and the same configurations as those of light emitting device 8b will not be described.

Light emitting device 8c according to Variation 3 includes light emitter 100c including first wavelength converter 3c (first phosphor 31c) and second wavelength converter 5, as shown in FIG. 4. First phosphor 31c has the same configuration as that of first phosphor 31b except that first phosphor 31c has a smaller particle diameter. First wavelength converter 3c is formed only of the single particle (first phosphor 31c) having a polyhedral particle shape derived from the garnet crystal structure.

In light emitting device 8c, the beam diameter of primary light 2 is greater than the particle diameter of first wavelength converter 3c. In more detail, the beam diameter of primary light 2 is greater than the maximum diameter of first wavelength converter 3c in a cross-section thereof perpendicular to the optical axis thereof. In other words, the size of first wavelength converter 3c is smaller than the beam diameter of primary light 2, and entire first wavelength converter 3c is therefore located within the beam of primary light 2.

As a result, since the light incident surface of first wavelength converter 3c (surface facing radiation source 1) can be entirely irradiated with primary light 2, primary light 2 can be efficiently converted into secondary light 4. Further, since the beam diameter of primary light 2 is sufficiently greater than the size of first wavelength converter 3c, first wavelength converter 3c can be readily so positioned that the area irradiated with primary light 2 can be maximized.

In light emitting device 8c, second wavelength converter 5 is likely to be directly irradiated with part of high-light-density primary light 2 without via first wavelength converter 3c. The at least part of primary light 2 is absorbed by second wavelength converter 5 and radiated in the form of fluorescence 62.

In a case where the size of second wavelength converter 5 is sufficiently greater than the area of the region where second wavelength converter 5 is directly irradiated with primary light 2 without via first wavelength converter 3c, the efficiency saturation occurs only in part of second wavelength converter 5. Therefore, in this case, output light 7 from light emitting device 8c is hardly affected.

(Second Embodiment)

[Schematic Configuration]

Figure 5:
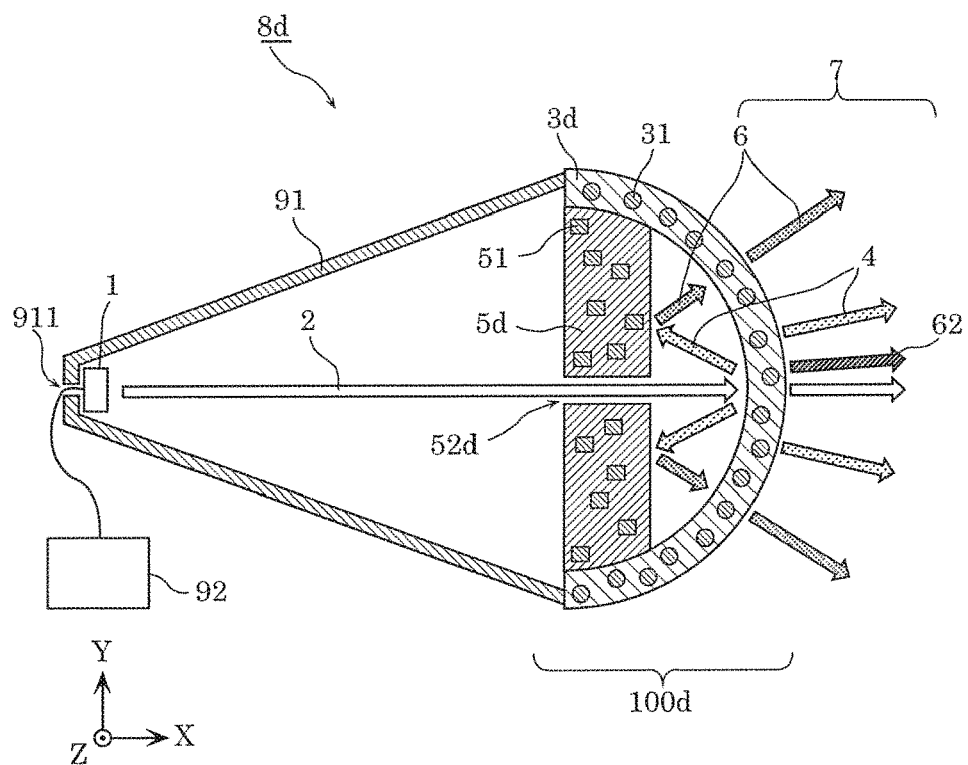
FIG. 5 is a schematic view showing the configuration of a light emitting device according to a second embodiment.

The configuration of a light emitting device according to a second embodiment will next be described with reference to FIG. 5. FIG. 5 is a schematic view showing the configuration of the light emitting device according to the second embodiment. The following description will be made primarily of differences between light emitting device 8d according to the second embodiment and light emitting device 8 according to the first embodiment, and the same configurations as those of light emitting device 8 will not be described.

Light emitting device 8d according to the second embodiment includes light emitter 100d including first wavelength converter 3d and second wavelength converter 5d, as shown in FIG. 5. Light emitting device 8d has an outer shell that is a combination of roughly conical cover 91 and roughly hemispherical first wavelength converter 3d with first wavelength converter 3d forming the bottom of cover 91. Radiation source 1 is located in the vicinity of the vertex of roughly conical cover 91, and primary light 2 radiated by radiation source 1 has an optical axis roughly parallel to the axis of roughly conical cover 91 (axis of cone). In light emitting device 8d, the positional relationship between first wavelength converter 3d and second wavelength converter 5d differs from the positional relationship in light emitting device 8.

[First Wavelength Converter]

In the second embodiment, first wavelength converter 3d is a film-shaped or thick-membrane-shaped wavelength converter having a thickness, for example, greater than or equal to 10 μm but smaller than or equal to 10 mm and is so formed as to have a hemispherical shape that surrounds second wavelength converter 5d. First wavelength converter 3d contains first phosphors 31.

[Second Wavelength Converter]

In the second embodiment, second wavelength converter 5d has a disk-like shape having a thickness greater than or equal to 10 μm but smaller than or equal to 10 mm. Through hole 52d having a diameter greater than or equal to 100 μm but smaller than or equal to 10 mm is formed in a central portion of second wavelength converter 5d. Second wavelength converter 5d is so disposed, for example, in the vicinity of the bottom of roughly conical cover 91 as to close the bottom. Second wavelength converter 5d contains second phosphors 51. The axis of through hole 52d is roughly parallel to the optical axis of primary light 2, and at least part of primary light 2 passes through through hole 52d.

[Primary Light, Secondary Light, Tertiary Light, and Output Light]

In the second embodiment, primary light 2 passes through through hole 52d and is applied to first wavelength converter 3d. First wavelength converter 3d (first phosphors 31) absorbs part of primary light 2 and converts absorbed primary light 2 into secondary light 4 in terms of wavelength. That is, first wavelength converter 3d emits secondary light 4. At least part of primary light 2 passes through first wavelength converter 3d and forms part of output light 7.

Secondary light 4 is emitted toward the interior and exterior of light emitting device 8d. Secondary light 4 emitted toward the interior of light emitting device 8d is applied to second wavelength converter 5d. Secondary light 4 emitted toward the exterior of light emitting device 8d forms part of output light 7.

At least part of secondary light 4, with which second wavelength converter 5d is irradiated, is absorbed by second wavelength converter 5d. Second wavelength converter 5d (second phosphors 51) absorbs part of secondary light 4 and converts absorbed secondary light 4 into tertiary light 6 in terms of wavelength. That is, second wavelength converter 5d emits tertiary light 6. At least part of tertiary light 6 emitted toward first wavelength converter 3d passes through first wavelength converter 3d and forms part of output light 7.

As described above, at least part of each of primary light 2, secondary light 4, and tertiary light 6 passes through first wavelength converter 3d. Further, at least part of each of primary light 2, secondary light 4, and tertiary light 6 is scattered in first wavelength converter 3d and second wavelength converter 5d.

At least part of each of primary light 2, secondary light 4, and tertiary light 6 may pass through second wavelength converter 5d and may be absorbed, scattered, or reflected at the inner surface of cover 91. Primary light 2, with which second wavelength converter 5d is irradiated, may be absorbed by second wavelength converter 5d, and fluorescence 62 emitted from second wavelength converter 5d may therefore be contained in output light 7.

Average color rendering index Ra of output light 7 is, for example, greater than or equal to 80 but smaller than or equal to 100. When average color rendering index Ra of output light 7 from light emitting device 8d is greater than or equal to 80 but smaller than or equal to 100, light emitting device 8d that outputs light preferred as illumination light is achieved. Examples of a method for causing average color rendering index Ra of output light 7 from light emitting device 8d to be greater than or equal to 80 but smaller than or equal to 100 may include a method for selecting any of laser light sources used in radiation source 1 that emit light beams that belong to different wavelength regions and a method for adjusting the type or the amount of first phosphor 31 contained in first wavelength converter 3d, second phosphor 51 contained in second wavelength converter 5d, and other phosphors and pigments or adjusting the distribution of the phosphors in each of the wavelength converters.

Output light 7 is outputted, for example, from first wavelength converter 3d. Therefore, even when second wavelength converter 5d has a highly visible body color, such as red, no discomfort results from the exterior appearance, whereby light emitting device 8d that excels in exterior appearance is achieved.

[Variation]

Figure 6:
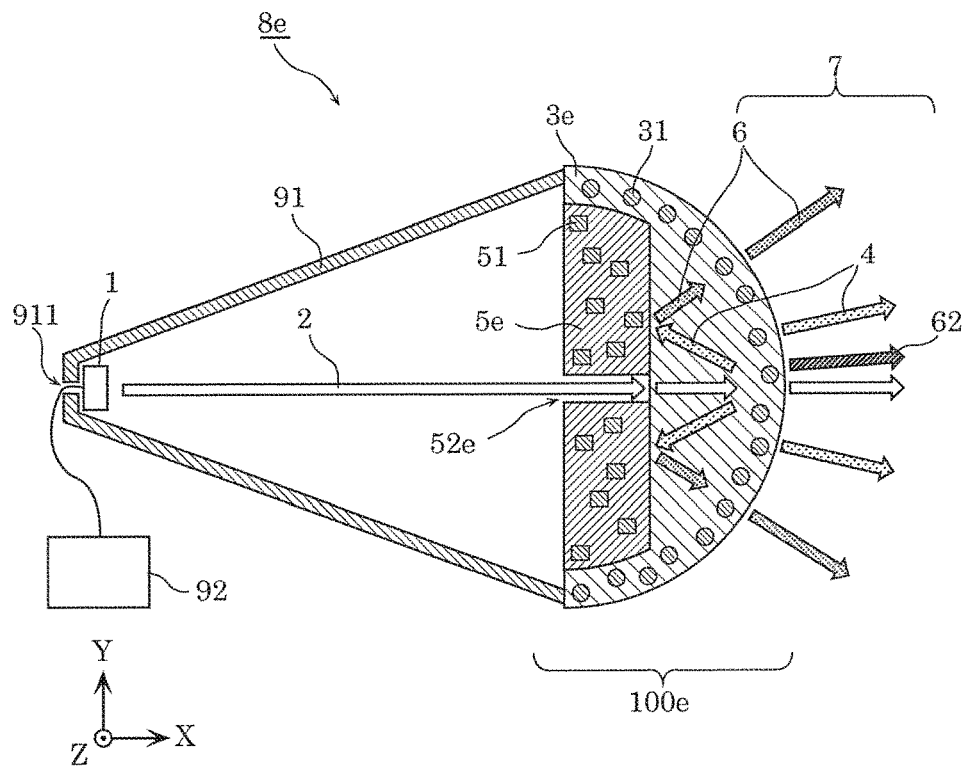
FIG. 6 is a schematic view showing the configuration of a light emitting device according to a variation of the second embodiment.

The configuration of a light emitting device according to a variation of the second embodiment will next be described with reference to FIG. 6. FIG. 6 shows the configuration of the light emitting device according to the variation of the second embodiment. The following description will be made primarily of differences between light emitting device 8e according to the variation of the second embodiment and light emitting device 8d, and the same configurations as those of light emitting device 8d will not be described.

Light emitting device 8e according to Variation 1 of the second embodiment includes light emitter 100e including first wavelength converter 3e and second wavelength converter 5e, as shown in FIG. 6. In light emitter 100e, first wavelength converter 3e is not a film-shaped or thick-membrane-shaped wavelength converter but has a certain thickness. First wavelength converter 3e and second wavelength converter 5e are physically in contact with each other. The thickness of first wavelength converter 3e is, for example, greater than or equal to 5 mm but smaller than or equal to 30 mm at the maximum.

Also in light emitting device 8e, primary light 2 passes through through hole 52e and is applied to first wavelength converter 3e. First wavelength converter 3e (first phosphors 31) absorbs part of primary light 2 and converts absorbed primary light 2 into secondary light 4 in terms of wavelength. That is, first wavelength converter 3e emits secondary light 4. Second wavelength converter 5e is irradiated with secondary light 4 emitted toward the interior of light emitting device 8e.

In the portion where first wavelength converter 3e and second wavelength converter 5e are physically in contact with each other, only one interface is present between first wavelength converter 3e and second wavelength converter 5e. Further, first wavelength converter 3e and second wavelength converter 5e are each made of a solid material, and the difference in refractive index therebetween is smaller than the difference between a gas and a solid.

On the other hand, in light emitting device 8d, first wavelength converter 3d and second wavelength converter 5d are not physically in contact with each other, and a gas layer is present between first wavelength converter 3d and second wavelength converter 5d, at least two interfaces are present therebetween. In the case where a gas layer is present between first wavelength converter 3d and second wavelength converter 5d, the differences in refractive indices between first wavelength converter 3d and the gas layer and between second wavelength converter 5d and the gas layer have larger values.

That is, light emitting device 8e can reduce optical loss due to reflection resulting from the difference in refractive index in the process in which the light propagates from first wavelength converter 3e to second wavelength converter 5e, as compared with light emitting device 8d. Light emitting device 8e can therefore output high-efficiency output light 7 with a smaller amount of optical loss.

When the surface that forms first wavelength converter 3e and faces primary light 2 is entirely in physical contact with the surface that forms second wavelength converter 5e and faces output light 7, the optical loss due to reflection resulting from the difference in refractive index can be reduced as compared with a case where the two surfaces are partially in contact with each other.

(Third Embodiment)

Figure 7:
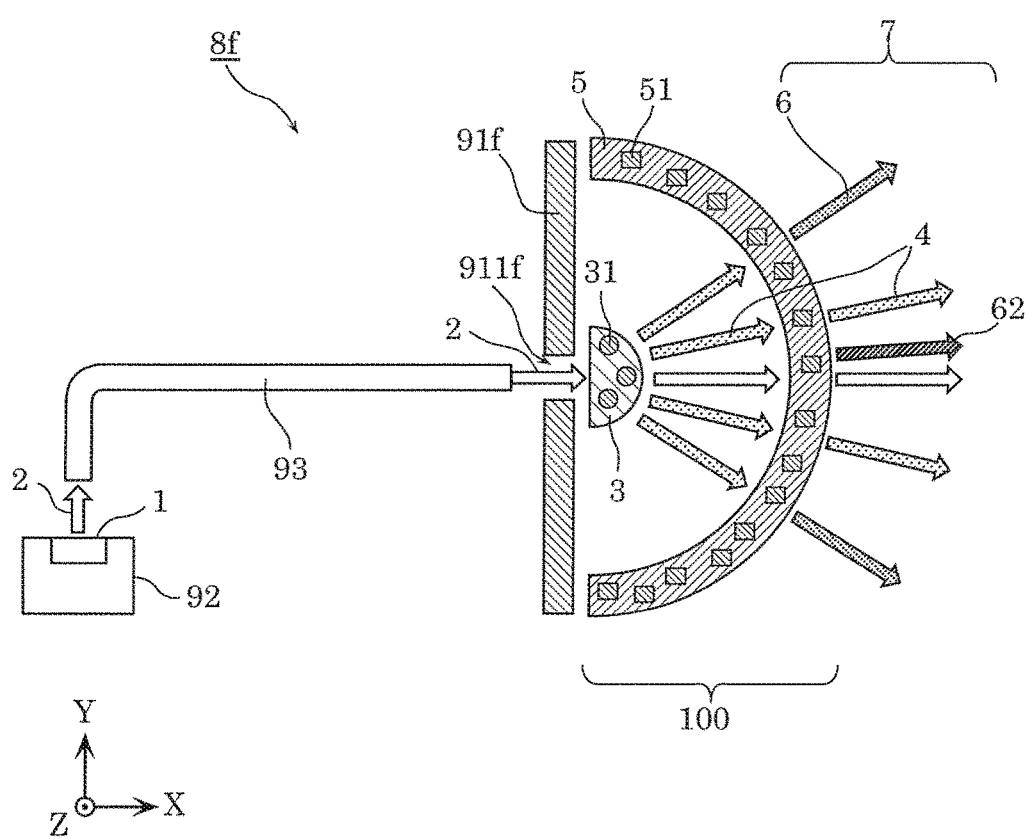
FIG. 7 is a schematic view showing the configuration of a light emitting device according to a third embodiment.

The configuration of a light emitting device according to a third embodiment will next be described with reference to FIG. 7. FIG. 7 is a schematic view showing the configuration of the light emitting device according to the third embodiment. The following description will be made primarily of differences between light emitting device 8f according to the third embodiment and light emitting device 8 according to the first embodiment, and the same configurations as those of light emitting device 8 will not be described.

Light emitting device 8f according to the third embodiment includes light emitter 100 including first wavelength converter 3 and second wavelength converter 5, as light emitting device 8 does, as shown in FIG. 7. In light emitting device 8f, radiation source 1 and external power supply 92 are integrated with each other.

Light emitting device 8f further includes optical waveguide 93. Optical waveguide 93 is specifically an optical fiber. Optical waveguide 93 may be a sheet-shaped or plate-shaped optical waveguide. Radiation source 1, external power supply 92, and optical waveguide 93 are disposed in the space outside a closed space formed by cover 91f and second wavelength converter 5. On the other hand, first wavelength converter 3 is disposed in the closed space. Primary light 2 radiated by radiation source 1 is guided along optical waveguide 93 and then applied to first wavelength converter 3.

Cover 91f has a disk-like shape, and through hole 911f having a diameter, for example, greater than or equal to 100 μm but smaller than or equal to 10 mm is formed at a central portion of cover 91f. Primary light 2 having passed through optical waveguide 93 passes through through hole 911f and is applied to first wavelength converter 3 in the closed space.

In light emitting device 8f, light emitter 100 and radiation source 1 are so positioned as to be separate from each other. For example, in a case where light emitting device 8f is used in an illumination application, only light emitter 100 formed of first wavelength converter 3 and second wavelength converter 5 may be disposed at a location to be illuminated. The device disposed at the location to be illuminated can therefore be compact.

In light emitting device 8f, a plurality of optical waveguides 93 may be connected to single radiation source 1. In this case, single radiation source 1 can radiate primary light 2 to a plurality of light emitters 100 corresponding to the plurality of optical waveguides 93.

(Fourth Embodiment)

[Schematic Configuration]

Figure 8:
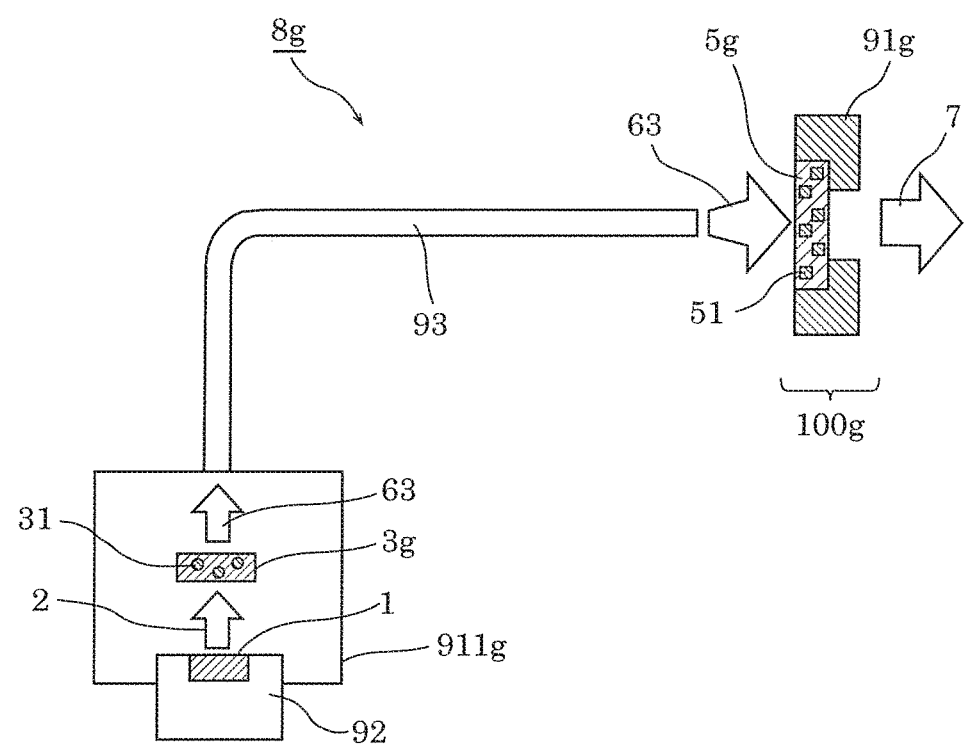
FIG. 8 is a schematic view showing the configuration of a light emitting device according to a fourth embodiment.

The configuration of a light emitting device according to a fourth embodiment will next be described with reference to FIG. 8. FIG. 8 is a schematic view showing the configuration of the light emitting device according to the fourth embodiment. The following description will be made primarily of differences between light emitting device 8g according to the fourth embodiment and light emitting device 8 according to the first embodiment, and the same configurations as those of light emitting device 8 will not be described.

Light emitting device 8g according to the fourth embodiment includes light source section 911g including radiation source 1 and first wavelength converter 3g, and light emitter 100g (second wavelength converter 5g) is irradiated with primary light 2 and secondary light 4 emitted from light source section 911g via optical waveguide 93, as shown in FIG. 8. Light emitter 100g includes second wavelength converter 5g and cover 91g (or support). The detailed configuration of light emitting device 8g will be described below with reference continuously to FIG. 8.

[Light Source Section]

In the fourth embodiment, radiation source 1 and first wavelength converter 3 are disposed in light source section 911g (enclosure of light source section 911g). Optical waveguide 93 is optically connected to light source section 911g. Part of primary light 2 radiated by radiation source 1 is converted by first wavelength converter 3g containing first phosphors 31 into secondary light 4 (not shown in FIG. 8). Combined light 63, which is the combination of the remainder of primary light 2 radiated by radiation source 1 and secondary light 4 emitted by first wavelength converter 3g enters optical waveguide 93.

[Optical Waveguide]

In the fourth embodiment, optical waveguide 93 has one end optically connected to light source section 911g and the other end optically connected to light emitter 100g. Optical waveguide 93 guides combined light 63 emitted by light source section 911g to a point in the vicinity of second wavelength converter 5g. Optical waveguide 93 is an optical fiber and may, for example, instead be a sheet-shaped or plate-shaped optical waveguide.

[Light Emitter]

In the fourth embodiment, light emitter 100g is formed of second wavelength converter 5g and cover 91g (or support). Light emitter 100g is optically connected to optical waveguide 93, and second wavelength converter 5g is irradiated with combined light 63, which is the combination of primary light 2 and secondary light 4 and guided through optical waveguide 93.

Second wavelength converter 5g contains second phosphors 51. Second wavelength converter 5g absorbs at least part of combined light 63 to emit tertiary light 6 (not shown in FIG. 8). Second wavelength converter 5g emits output light 7 containing combined light 63 and tertiary light 6.

In light emitting device 8g, only light emitter 100g formed of second wavelength converter 5g and cover 91g may be disposed at a location to be illuminated. Light emitter 100g does not contain first wavelength converter 3g. In light emitting device 8g, light emitter 100g can therefore be compact.

[Variation]

Figure 9:
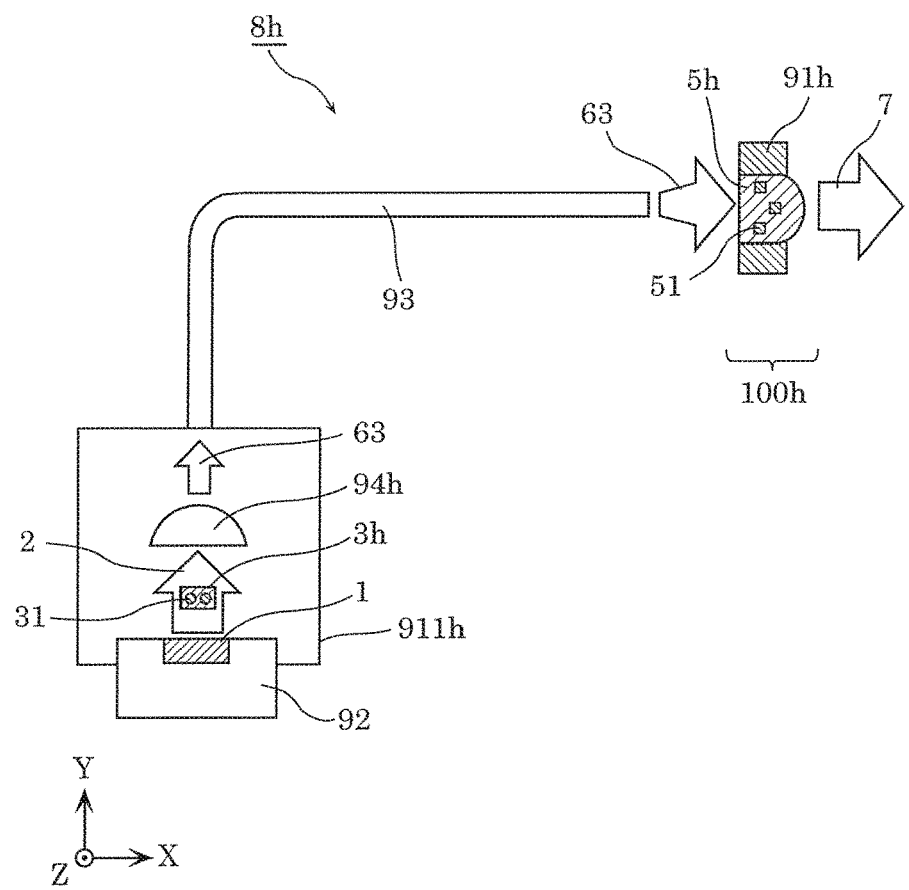
FIG. 9 is a schematic view showing the configuration of a light emitting device according to a variation of the fourth embodiment.

The configuration of a light emitting device according to a variation of the fourth embodiment will next be described with reference to FIG. 9. FIG. 9 is a schematic view showing the configuration of the light emitting device according to the variation of the fourth embodiment. The following description will be made primarily of differences between light emitting device 8h according to the variation of the fourth embodiment and light emitting device 8g according to the fourth embodiment, and the same configurations as those of light emitting device 8g will not be described.

The size of first wavelength converter 3h provided in light emitting device 8h is smaller than the beam diameter of primary light 2, as shown in FIG. 9. In other words, the beam diameter of primary light 2 is greater than the particle size of first wavelength converter 3h.

As a result, the entire light incident surface of first wavelength converter 3h (surface facing radiation source 1) can be irradiated with primary light 2, whereby primary light 2 can be efficiently converted into secondary light 4 (not shown in FIG. 9). Further, when the beam diameter of primary light 2 is sufficiently greater than the size of first wavelength converter 3h, first wavelength converter 3h is readily so positioned that the area irradiated with primary light 2 can be maximized.

Light emitting device 8h further includes light collector lens 94h. In light emitting device 8h, primary light 2 having been radiated from radiation source 1 but has not passed through first wavelength converter 3h, primary light 2 having been radiated from radiation source 1 and has passed through or has been scattered by first wavelength converter 3h, and secondary light 4 converted by first wavelength converter 3h in terms of wavelength are collected by collector lens 94h onto the end of optical waveguide 93. Combined light 63 formed of primary light 2 and secondary light 4 therefore efficiently enters optical waveguide 93.

Light emitter 100h provided in light emitting device 8h includes second wavelength converter 5h and cover 91h (or support). Second wavelength converter 5h differs from second wavelength converter 5g in terms of shape. Second wavelength converter 5h does not necessarily has a specific shape and has, for example, a flat-plate-like shape, a hemispherical shape, a bowl-like shape, a bullet-like shape, a conical shape, a pyramidal shape, or a columnar shape. Second wavelength converter 5h has, for example, a round convex surface and may instead have a flat surface or a shape having irregularities.

For example, in the case where the light output surface is a round convex surface, a point light source is readily designed, whereby light emitter 100h that readily allows size reduction is achieved. In the case where the light output surface is a flat surface, light emitter 100h that readily allows thickness reduction and excels in exterior appearance is achieved. In the case where the light output surface has irregularities, light emitter 100h that is advantageous in terms of light extraction efficiency is achieved.

(Fifth Embodiment)

Figure 10:
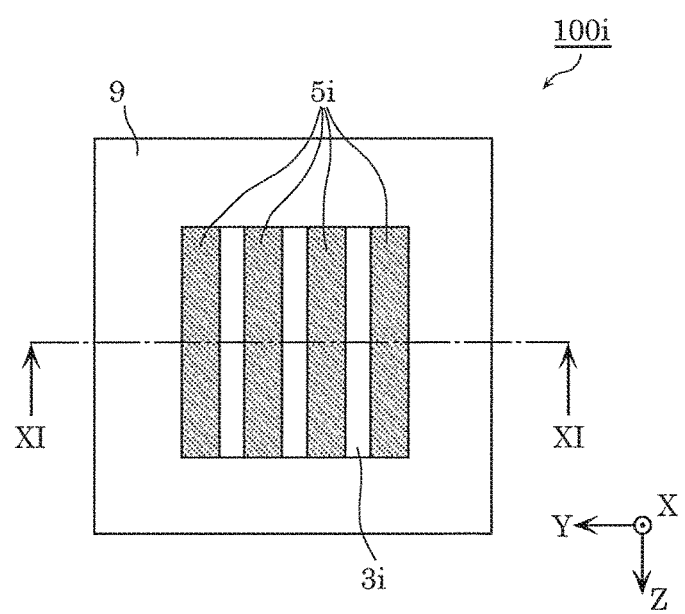
FIG. 10 is a top view of a light emitter according to a fifth embodiment.
Figure 11:
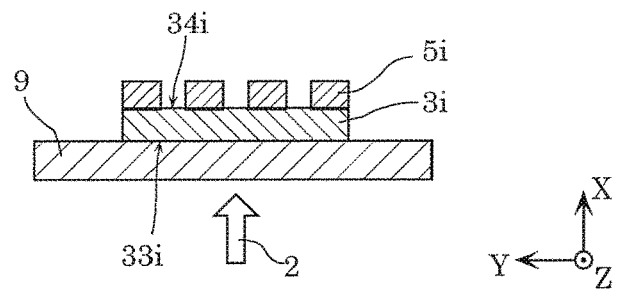
FIG. 11 is a diagrammatic cross-sectional view taken along the line XI-XI in FIG. 10.

The light emitter described in any of the aforementioned embodiments may be, for example, so configured that the first wavelength converter and the second wavelength converter are layered on a substrate. A thus configured light emitter according to a fifth embodiment will be described below. FIG. 10 is a top view of the light emitter according to the fifth embodiment, and FIG. 11 is a diagrammatic cross-sectional view taken along the line XI-XI in FIG. 10. In the following description, items having already been described in any of the aforementioned embodiments will not be described.

Light emitter 100i according to the fifth embodiment includes substrate 9, first wavelength converter 3i (first wavelength conversion layer), and second wavelength converter 5i (second wavelength conversion layer), as shown in FIGS. 10 and 11.

Substrate 9 is a plate having a rectangular shape in the plan view and has translucency. First wavelength converter 3i is formed on one principal surface of substrate 9, and primary light 2 is incident on the other principal surface of substrate 9. That is, the other principal surface of substrate 9 faces radiation source 1. Substrate 9 is, for example, a sapphire substrate but is not limited to a specific substrate. Further, substrate 9 does not necessarily have a specific shape and may, for example, have a circular shape in the plan view.

To form first wavelength converter 3$i$, first wavelength converter 3$i$ is, for example, printed on the one principal surface of substrate 9. First wavelength converter 3$i$ absorbs at least part of primary light 2 radiated by radiation source 1 and converts absorbed primary light 2 into secondary light 4. First wavelength converter 3$i$ contains first phosphors 31 (not shown in FIG. 10 or 11) but no second phosphors 51. That is, first phosphors 31 contained in first wavelength converter 3$i$ are greater than second phosphors 51 contained therein. First wavelength converter 3$i$ has a rectangular shape in the plan view but may have a circular shape or any other shape.

First wavelength converter 3$i$ specifically has light incident surface 33$i$, on which primary light 2 radiated by radiation source 1 is incident, and light exiting surface 34$i$, which is opposite to light incident surface 33$i$. Second wavelength converter 5$i$ is formed on light exiting surface 34$i$.

To form second wavelength converter 5$i$, second wavelength converter 5$i$ is, for example, printed on light exiting surface 34$i$ of first wavelength converter 3$i$. Second wavelength converter 5$i$ absorbs at least part of secondary light 4 emitted by first wavelength converter 3$i$ and converts absorbed secondary light 4 into tertiary light 6. Second wavelength converter 5$i$ contains second phosphors 51 (not shown in FIG. 10 or 11) but no first phosphors 31. That is, second phosphors 51 contained in second wavelength converter 5$i$ are greater than first phosphors 31 contained therein.

Second wavelength converter 5$i$ is so formed on light exiting surface 34$i$ of first wavelength converter 3$i$ as to form stripes in the plan view and therefore partially covers light exiting surface 34$i$. When light exiting surface 34$i$ of first wavelength converter 3$i$ is entirely covered with second wavelength converter 5$i$, an excessive amount of secondary light 4 (yellow light or green light) is absorbed by second wavelength converter 5$i$ in some cases. To avoid such cases, it is useful to employ a structure in which second wavelength converter 5$i$ partially covers light exiting surface 34$i$ of first wavelength converter 3$i$. Out of light exiting surface 34$i$ of first wavelength converter 3$i$ in the plan view, the proportion of the portion that is not covered with second wavelength converter 5$i$ (proportion of exposed first wavelength converter 3$i$) is set at a fixed value. The fixed proportion is, for example, higher than or equal to 5% but lower than or equal 95%.

Figure 12:
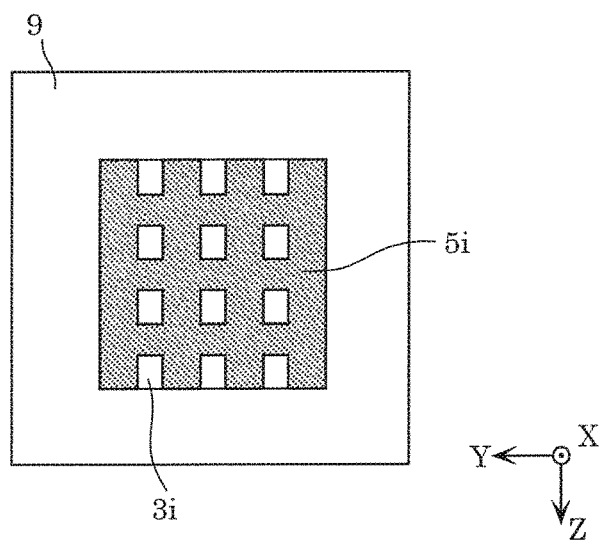
FIG. 12 shows a second wavelength converter so formed as to form a lattice.
Figure 13:
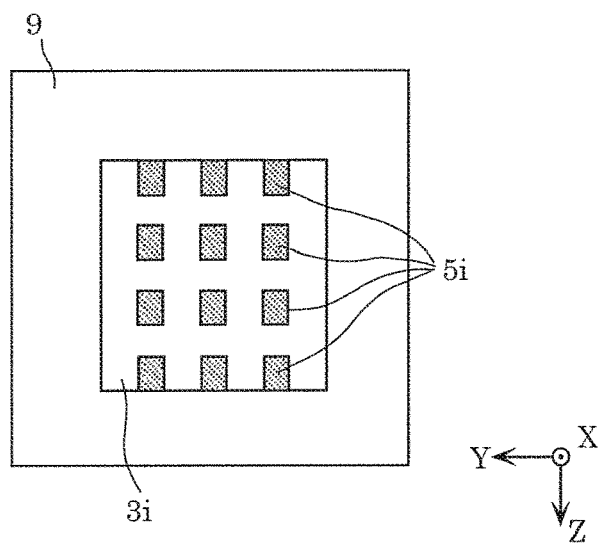
FIG. 13 shows a second wavelength converter so formed as to form dots.

Second wavelength converter 5$i$ is not necessarily so formed as to form stripes as long as it partially covers light exiting surface 34$i$. Second wavelength converter 5$i$ may be so formed as to form, for example, a lattice, as shown in FIG. 12 or dots, as shown in FIG. 13. FIG. 12 shows second wavelength converter 5$i$ so formed as to form a lattice, and FIG. 13 shows second wavelength converter 5$i$ so formed as to form dots. Second wavelength converter 5$i$ may be so formed as to have a shape that is a combination of stripes, a lattice, and dots.

The thickness of the wavelength converter (wavelength conversion layer) that is the combination of first wavelength converter 3$i$ and second wavelength converter 5$i$ is, for example, greater than or equal to 10 μm but smaller than or equal to 100 μm.

[Variation]

Figure 14:
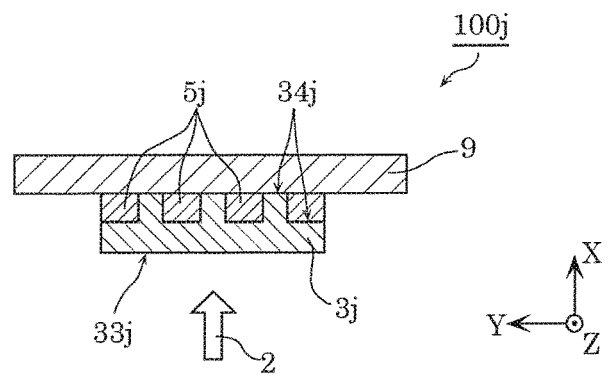
FIG. 14 is a diagrammatic cross-sectional view of a light emitter according to a variation of the fifth embodiment.

The configuration of a light emitter according to a variation of the fifth embodiment will next be described with reference to FIG. 14. FIG. 14 is a diagrammatic cross-sectional view of the light emitter according to the variation of the fifth embodiment. The following description will be made primarily of differences between light emitter 100$j$ according to variation of the fifth embodiment and light emitter 100$i$ according to the fifth embodiment, and the same configurations as those of light emitter 100$i$ will not be described.

In light emitter 100$j$, second wavelength converter 5$j$ is intermittently formed on the other principal surface of substrate 9, and first wavelength converter 3$j$ is so formed as to cover second wavelength converter 5$j$, as shown in FIG. 14. Also in this case, primary light 2 is incident on light incident surface 33$j$ of first wavelength converter 3$j$, and light exiting surface 34$i$ of first wavelength converter 3$j$ is partially covered with second wavelength converter 5$j$. In light emitter 100$j$, first wavelength converter 3$j$ may be positioned in the gaps of second wavelength converter 5$j$, as shown in FIG. 14.

In light emitter 100$j$, substrate 9 may or may not have translucency. In the case where substrate 9 has translucency, output light 7 is outputted upward (toward positive side of x axis). In a case where substrate 9 has no translucency but has, for example, light reflectivity, output light 7 is outputted downward (toward negative side of x axis).

(Sixth Embodiment)

[Test Environment]

Figure 15:
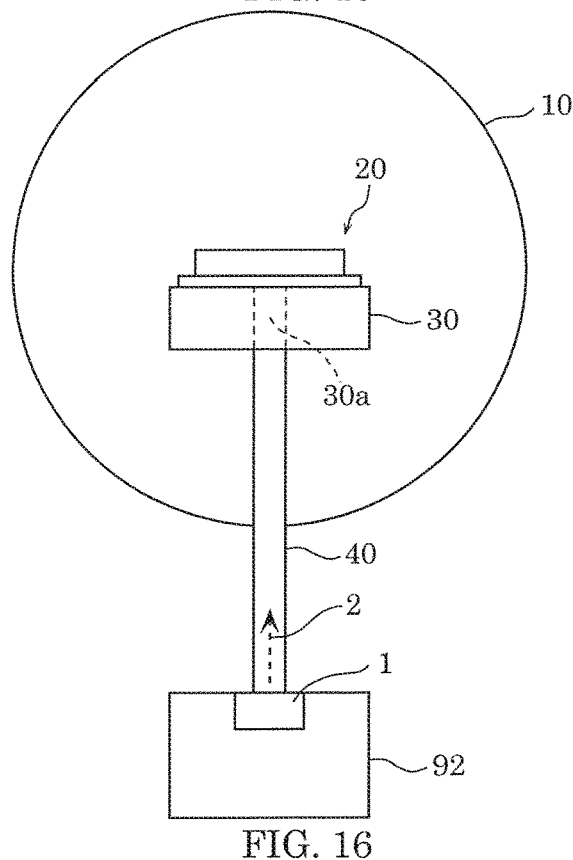
FIG. 15 is a diagrammatic view showing the environment of a test for describing effects provided by the light emitting device according to any of the embodiments.

As a sixth embodiment, a description will be made of test results for describing effects provided by the light emitting device according to any of the embodiments described above. A test environment will first be described. FIG. 15 is a diagrammatic view showing the environment of a test for describing the effects provided by the light emitting device according to any of the embodiments.

Light emitters (samples) to be tested are light emitter 20 according to any of the embodiments described above and light emitter 25 according to Comparative Example. The light emitters to be tested are each placed at the center of stage 30 disposed in ϕ20-inch integrating sphere 10. Stage 30 is made of a metal, and the light emitter is fixed to stage 30. Stage 30 is provided with through hole 30$a$, through which optical fiber 40 is inserted, and the light emitter to be tested is radiated with primary light 2 (blue laser light) from radiation source 1 through optical fiber 40. The blue laser light has an emission peak wavelength of 445 nm.

The optical power density of the blue laser light with which the light emitter under the test is irradiated is increased by an optical lens. Further, the spot diameter of the blue laser light with which the light emitter is irradiated is adjusted to a diameter greater than or equal to 1 mmϕ but smaller than or equal to 3 mm.

The optical lens is used to create an environment in which the optical power density is increased in the evaluation and is not an essential component for the light emitter under the test. In the light emitting device according to any of the embodiments described above, the optical power density can be increased, for example, by increasing the electric power supplied from external power supply 92 to radiation source 1.

[Light Emitting Device to be Tested]

Figure 16:
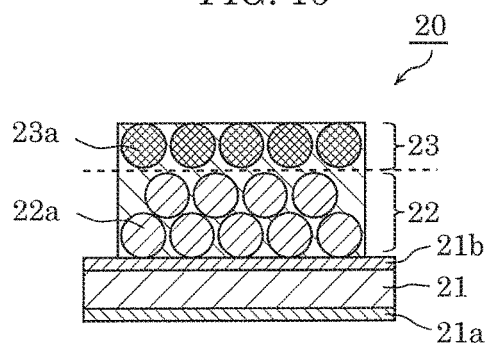
FIG. 16 is a diagrammatic cross-sectional view of a light emitter according to a sixth embodiment.
Figure 17:
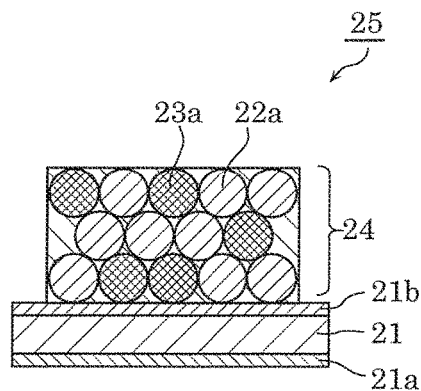
FIG. 17 is a diagrammatic cross-sectional view of a light emitter according to Comparative Example.

The light emitting device to be tested will next be described. The light emitting device to be tested was light emitter 20, the configuration of which is a replica of the configuration of the light emitter according to any of the embodiments described above, and the light emitter according to Comparative Example. FIG. 16 is a diagrammatic cross-sectional view of light emitter 20. FIG. 17 is a diagrammatic cross-sectional view of the light emitter according to Comparative Example.

Light emitter 20 according to the sixth embodiment includes sapphire substrate 21, first wavelength converter 22, and second wavelength converter 23, as shown in FIG. 16. First wavelength converter 22 contains first phosphors 22a, and second wavelength converter 23 contains second phosphors 23a. First phosphors 22a correspond to first phosphors 31 in the embodiments described above, and second phosphors 23a correspond to second phosphors 51 in the embodiments described above.

AR coat film 21a is formed on sapphire substrate 21, specifically, on the surface thereof on which the blue laser light is incident. Dichroic mirror film 21b is formed on sapphire substrate 21, specifically, on the surface thereof on which first wavelength converter 22 is placed (surface onto which first wavelength converter 22 is applied). Sapphire substrate 21 has a 9.0-mm square shape and a thickness of 0.3 mm.

The procedure of formation of light emitter 20 is as follows: First, a first phosphor paste for forming first wavelength converter 22 and second phosphor paste for forming second wavelength converter 23 are produced.

First phosphor paste contains first phosphors 22a. A commercially available YAG (yttrium aluminum garnet) green phosphor was used as first phosphors 22a. The commercially available YAG green phosphor is specifically a YAG green phosphor having central particle diameter $D_{50}$ of 5 μm and activated by $Ce^{3+}$.

To form first phosphors 22a, a liquid organic/inorganic hybrid glass material and a solvent are mixed with first phosphors 22a at a solid content ratio of 60 volume portions of first phosphors 22a to 40 volume portions of the glass, and the mixture is kneaded by using an alumina mortar. The first phosphor paste is thus formed. The organic/inorganic hybrid glass material is specifically a siloxane-based compound having a main chain skeleton formed of an Si—O bond (silsesquioxane expressed by compositional formula $[(RSiO_{1.5})n]$). The solvent is specifically diethylene glycol monomethyl ether.

On the other hand, the second phosphor paste contains second phosphors 23a. A commercially available SCASN (alkaline earth metal aluminosilicate nitride) red phosphor was used as second phosphors 23a. The commercially available SCASN red phosphor is specifically an SCASN red phosphor having central particle diameter $D_{50}$ of 12 μm and activated by $Eu^{2+}$.

To form second phosphors 23a, a liquid glass material and a solvent are mixed with second phosphors 23a at a solid content ratio of 60 volume portions of second phosphors 23a to 40 volume portions of the glass, and the mixture is kneaded by using an alumina mortar. The second phosphor paste is thus formed. The liquid glass material and the solvent used to form the second phosphor paste are the same as those used to form the first phosphor paste.

The first phosphor paste is screen-printed on dichroic mirror film 21b formed on one side of sapphire substrate 21. The printed first phosphor paste is so heated at 80° C. for 60 minutes that the solvent is removed from the paste. The first phosphor paste from which the solvent was removed is thermally cured at 150° C. for 8 hours. First wavelength converter 22 is thus formed.

First wavelength converter 22 is a single substance layer (YAG single substance layer) formed of first phosphors 22a, has a 7-mm-diameter circular shape in the plan view (shape viewed in direction perpendicular to principal surface of sapphire substrate 21), and has a thickness of about 3 μm.

The second phosphor paste is then printed on first wavelength converter 22. Second wavelength converter 23 is then formed by using the same manufacturing method (procedure and condition) for forming first wavelength converter 22. Second wavelength converter 23 is a single substance layer (SCASN single substance layer) formed of second phosphors 23a and has a thickness of about 15 μm.

Light emitter 20 includes sapphire substrate 21, first wavelength converter 22, and second wavelength converter 23, as described above. First wavelength converter 22 and second wavelength converter 23 are in other words a layered fluorescent film having a thickness of 45 μm.

On the other hand, wavelength converter 24 provided in light emitter 25 according to Comparative Example is formed by printing a phosphor paste containing both first phosphors 22a and second phosphors 23a on dichroic mirror film 21b on sapphire substrate 21 and then using the same manufacturing method for forming first wavelength converter 22 and second wavelength converter 23. Wavelength converter 24 is in other words a mixture fluorescent film containing the YAG green phosphors and the SCASN red phosphors. Wavelength converter 24 has a thickness of about 40 μm.

[Efficiency Saturation]

Results of a test for the efficiency saturation of light emitters 20 and 25 will be described below. In the test for the efficiency saturation, electric power supplied to the laser diode provided in radiation source 1 was defined in advance with a power meter in such a way that the output from radiation source 1 is 6 W (3 W+3 W), and the temperature of the laser diode was also defined.

The intensity and color tone (spectral distribution) of the light outputted by light emitter 20 or 25 were examined by changing the spot diameter of the blue laser light with which light emitter 20 or 25 is irradiated to three values, φ3 mm, φ2 mm, and φ1 mm to change the density of the light with which light emitter 20 or 25 is irradiated (power density of excitation light).

The intensity and color tone of the output light was measured after it was ascertained that the temperature of light emitter 20 or 25 reached a predetermined value. Specifically, the surface temperature of each of light emitters 20 and 25 was checked in infrared thermography (model T620 manufactured by FLIR). The surface temperature increased from about 70° C. to about 220° C. as the power density of the excitation light increased, but the tendency of the increase in the temperature does not greatly vary between light emitters 20 and 25. That is, in the measurement of the intensity and color tone of the output light, there is hardly a difference in temperature condition between light emitters 20 and 25.

Figure 18:
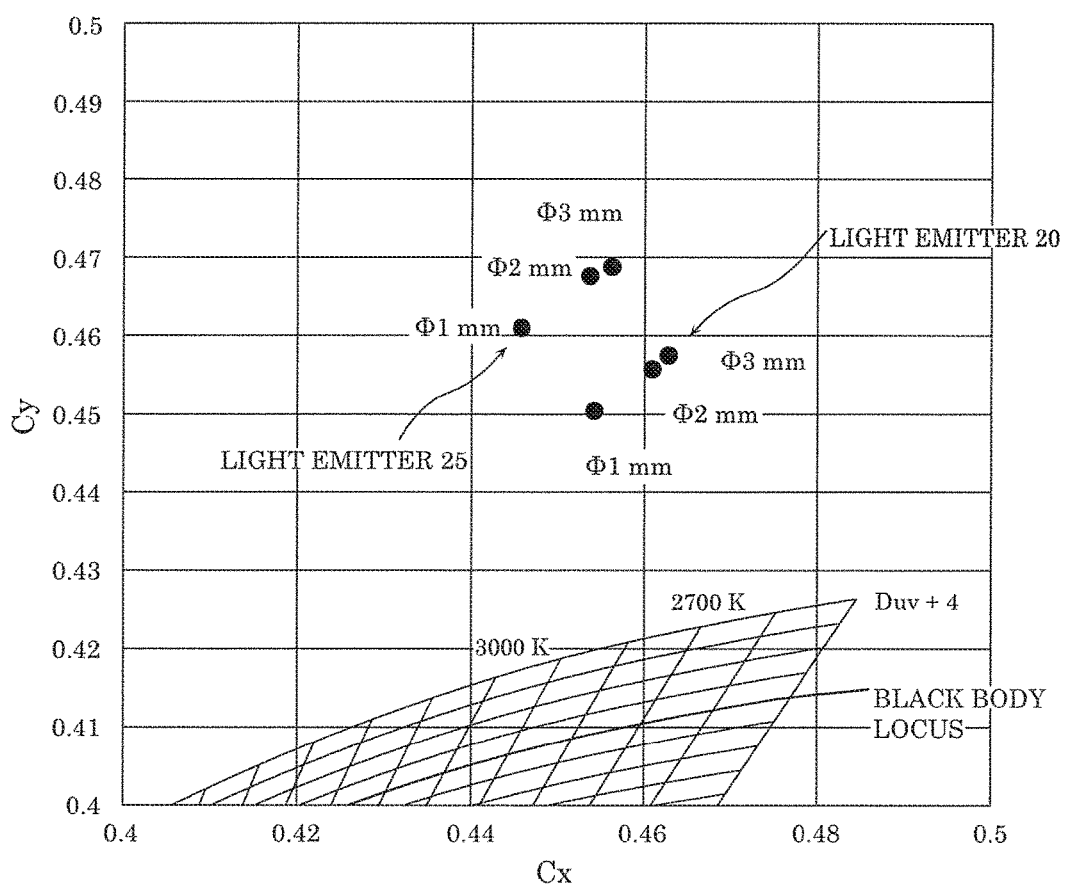
FIG. 18 shows the chromaticity of the output light from the light emitter according to the sixth embodiment in the CIE chromaticity coordinates.

The output light from light emitter 20 contains blue light having passed through first wavelength converter 22 and second wavelength converter 23, green light emitted by first phosphors 22a, and the red light emitted by second phosphors 23a. The output light from light emitter 20 is white light that is the additive color mixture of the three types of light. FIG. 18 shows the chromaticity of the output light from light emitter 20 in the CIE chromaticity coordinates, and the chromaticity (x, y) of the output light from light emitter 20 falls within the following ranges: 0.42<x<0.47; and 0.45<y<0.47. FIG. 18 also shows the chromaticity of the output light from light emitter 25.

Figure 19:
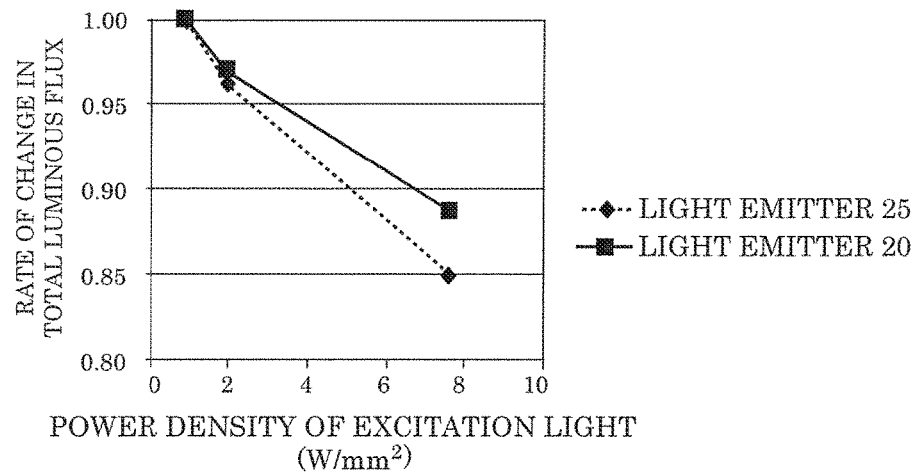
FIG. 19 shows the rate of change in the total luminous flux of the output light versus the power density of excitation light.

A description will be first made of a change in the total luminous flux of the output light versus the power density of the excitation light. FIG. 19 shows the rate of the change in the total luminous flux of the output light versus the power density of the excitation light.

The rate of the change in the total luminous flux decreases as the excitation power density increases, as shown in FIG. 19. The rate of the decrease in the total light flux from light emitter 20 is, however, smaller than the rate of the decrease in the total luminous flux from light emitter 25 according to Comparative Example. That is, in a light emitting device achieved by light emitter 20, the total luminous flux decreases as the power density of the excitation light increases by a smaller amount than in a light emitting device achieved by light emitter 25 according to Comparative Example.

Figure 20:
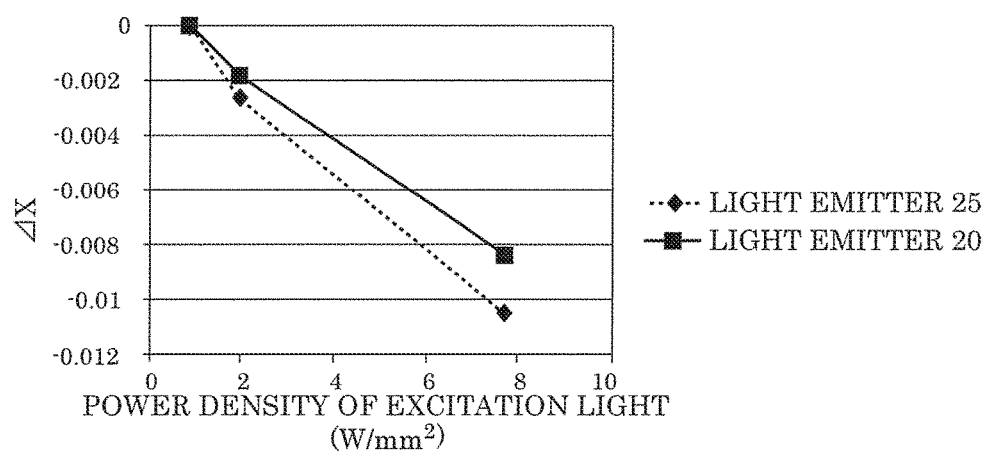
FIG. 20 shows the amount of change $\Delta x$ in the chromaticity x of the output light versus the power density of the excitation light.
Figure 21:
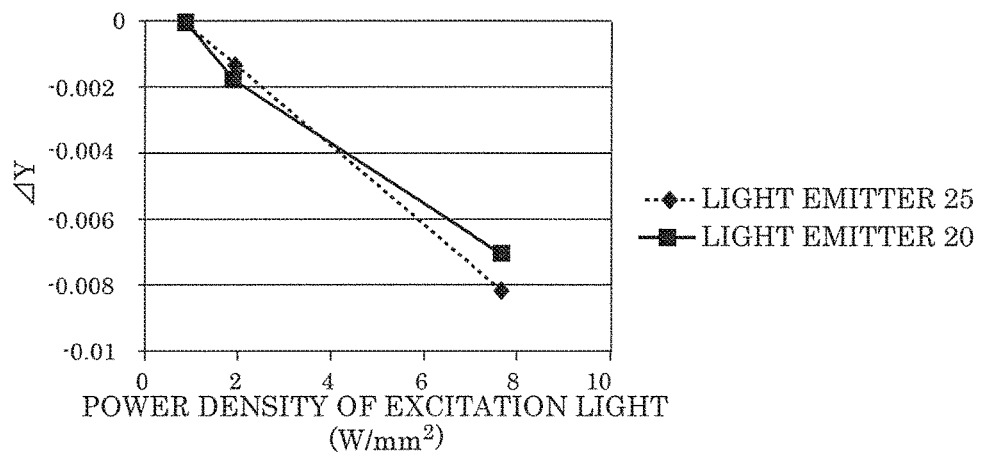
FIG. 21 shows the amount of change $\Delta y$ in the chromaticity y of the output light versus the power density of the excitation light.
Figure 22:
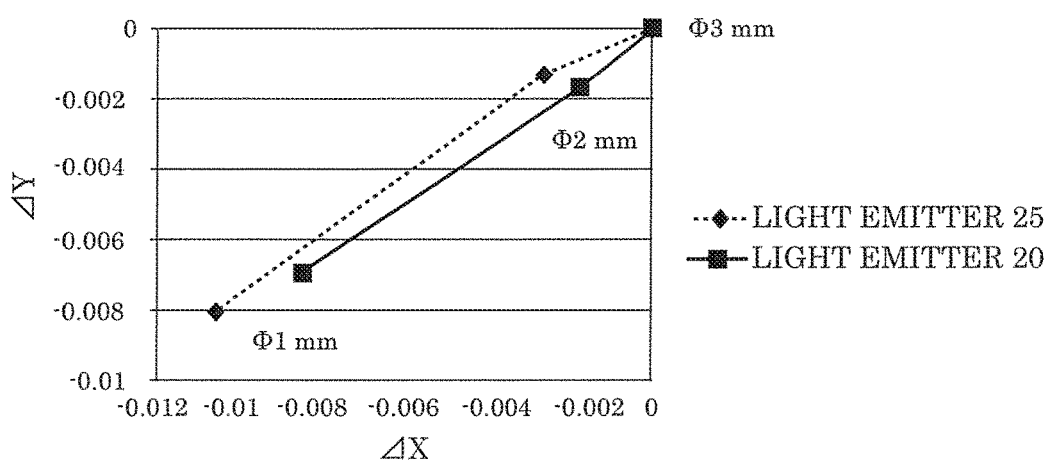
FIG. 22 shows the amount of change Δx in the chromaticity x and the amount of change Δy in the chromaticity y of the output light versus the power density of the excitation light.

A description will next be made of a change in chromaticity of the output light versus the power density of the excitation light. FIG. 20 shows the amount of change $\Delta x$ in the chromaticity x of the output light versus the power density of the excitation light. FIG. 21 shows the amount of change $\Delta y$ in the chromaticity y of the output light versus the power density of the excitation light. FIG. 22 shows the amount of change $\Delta x$ in the chromaticity x and the amount of change $\Delta y$ in the chromaticity y of the output light versus the power density of the excitation light (spot diameter of blue laser light).

The amount of change $\Delta x$ in the chromaticity x and the amount of change $\Delta y$ in the chromaticity y each decrease as the power density of the excitation light increases, as shown in FIGS. 20 to 22. The change in the chromaticity of the light from light emitter 20 is, however, smaller than the chromaticity of the light from in light emitter 25 according to Comparative Example. That is, in a light emitting device achieved by light emitter 20, the chromaticity (color tone) changes as the power density of the excitation light increases by a smaller amount than in a light emitting device achieved by light emitter 25 according to Comparative Example.

As described above, in light emitter 20, second phosphors 23a (red phosphors) is unlikely to experience the efficiency saturation even when the phosphors are excited with the high-light-density blue laser light. Therefore, light emitter 20 allows a light emitting device that outputs high-power light and excels in stability of the color tone of the output light to be achieved in a relatively simple configuration.

(Summary)

As described above, light emitting device 8 includes radiation source 1, which radiates laser light as primary light 2, first wavelength converter 3, which contains first phosphors 31, which absorb at least part of primary light 2 radiated by radiation source 1 and convert absorbed primary light 2 into secondary light 4, and second wavelength converter 5, which contains second phosphors 51, absorb at least part of secondary light 4 emitted by first wavelength converter 3 and convert absorbed secondary light 4 into tertiary light 6. Light emitting device 8 emits output light 7 containing primary light 2, secondary light 4, and tertiary light 6. Secondary light 4 contains a larger amount of long-wavelength component than primary light 2, and tertiary light 6 contains a larger amount of long-wavelength component than secondary light 4. The lifetime of the fluorescence emitted from second phosphors 51 is longer than the lifetime of the fluorescence emitted from first phosphors 31, and the light density of secondary light 4, with which second wavelength converter 5 is irradiated, is lower than the light density of primary light 2, with which first wavelength converter 3 is irradiated. The same holds true for light emitting devices 8a to 8h.

Therefore, since the light density of secondary light 4, with which second wavelength converter 5 is irradiated, is lower than the light density of primary light 2, with which first wavelength converter 3 is irradiated, the efficiency saturation of second phosphors 51 can be suppressed. Since the configuration described above can suppress the efficiency saturation of first phosphors 31 with use of no optical member or any other component, compact light emitting device 8 is achieved.

Radiation source 1 may include a solid-state light emitting element.

The size of radiation source 1 can therefore be reduced, whereby the size of light emitting device 8 can be reduced.

The light density of secondary light 4, with which second wavelength converter 5 is irradiated, may be less than or equal to 1/10 of the light density of primary light 2, with which first wavelength converter 3 is irradiated.

Since the light density of the excitation light that excites second phosphors 51 is therefore lower than the light density of primary light 2 radiated from radiation source 1 by at least one order of magnitude, the efficiency saturation of second phosphors 51 is unlikely to occur. That is, since the conversion efficiency increases in the wavelength conversion from secondary light 4 into tertiary light 6 in second wavelength converter 5, light emitting device 8 in which the intensity of tertiary light 6 is increased can be achieved.

Radiation source 1 may radiate, as primary light 2, blue light having an emission spectrum showing a maximum peak intensity in the region having a wavelength of at least 420 nm and at most 480 nm.

When primary light 2 has a maximum peak intensity in the wavelength region described above, primary light 2 is readily visually recognizable blue light. Primary light 2 can therefore be used without waste not only as the excitation light that excites first phosphors 31 and second phosphors 51 but as output light 7 from light emitting device 8.

First phosphors 31 may emit, as secondary light 4, light having an emission spectrum showing a maximum peak intensity in the region having a wavelength of at least 480 nm and at most 600 nm.

In this case, secondary light 4 emitted from first phosphors 31 is visible light having high luminous efficacy, whereby high-luminous-flux light emitting device 8 is achieved by using secondary light 4 as illumination light.

First phosphors 31 may each be a $Ce^{3+}$ activated phosphor.

The efficiency saturation of first phosphors 31 can therefore be suppressed in the case where first phosphors 31 excited with the high-light-density primary light 2.

First phosphors 31 may have the garnet crystal structure.

In this case, secondary light 4 emitted by first phosphors 31 having the garnet crystal structure allows suppression of the efficiency saturation of second phosphors 51.

First phosphors 31 may be formed of at least one single crystal.

In this case, first phosphors 31 each have a small number of internal defects, whereby light emitting device 8 in which first phosphors 31 cause only a small amount of wavelength conversion loss is achieved.

In light emitting device 8b (or light emitting device 8c), first wavelength converter 3b is formed only of first phosphor 31b, and first phosphor 31b is formed of a single particle having a polyhedral particle shape derived from the garnet crystal structure.

Since thus configured first wavelength converter 3b (first phosphor 31b) is compact and excels in crystal quality, compact, high-power light emitting device 8b is achieved.

Second phosphors 51 may each be an $Eu^{2+}$ activated phosphor.

Second phosphors 51 therefore emit light having an emission spectrum having a narrow half width that cannot be achieved by a $Ce^{3+}$ activated phosphor, whereby light emitting device 8 that readily controls the spectrum of output light 7 can be achieved.

Second phosphors 51 may emit, as tertiary light 6, light having an emission spectrum showing a maximum peak intensity in the region having a wavelength of at least 600 nm and at most 660 nm.

Using thus configured second phosphors 51 allows output light 7 from light emitting device 8 to contain a large amount of red component, whereby light emitting device 8 suitable for high-color-rendering illumination can be achieved.

Second phosphors 51 may each be a nitride phosphor or an oxynitride phosphor.

When second phosphors 51 are each a nitride phosphor or an oxynitride phosphor, second phosphors 51 are chemically stable, have high excitation light absorptance, and can efficiently convert absorbed excitation light into light having a wavelength longer than the excitation light.

Second phosphors 51 may be a compound having the same crystal structure as that of $CaAlSiN_3$.

Readily procurable second phosphors 51 can therefore be used to achieve light emitting device 8 that outputs high-power, highly reliable output light.

Light emitting device 8 may further include optical waveguide 93 at least between radiation source 1 and first wavelength converter 3 or between first wavelength converter 3 and second wavelength converter 5, as in light emitting devices 8f, 8g, and 8h. At least one of primary light 2, secondary light 4, and tertiary light 6 may be guided through optical waveguide 93.

As a result, in the case where light emitting device 8 is used in an illumination application, the device disposed at the location to be illuminated can be compact.

First wavelength converter 3 may be positioned between radiation source 1 and second wavelength converter 5.

As a result, since second wavelength converter 5 is unlikely to be directly irradiated with primary light 2, the efficiency saturation of second phosphors 51 can be suppressed.

In light emitter 100i, first wavelength converter 3i has light incident surface 33i, on which primary light 2 radiated by radiation source 1 is incident, and light exiting surface 34i, which is opposite to light incident surface 33i, and second wavelength converter 5i partially covers light exiting surface 34i of first wavelength converter 3i.

As a result, the situation in which an excessive amount of secondary light 4 is absorbed by second wavelength converter 5i can be avoided.

Light exiting surface 34i of first wavelength converter 3i may be partially covered with second wavelength converter 5i so formed on light exiting surface 34i as to form stripes, a lattice, or dots.

When second wavelength converter 5i is formed in the shape (pattern) described above, color unevenness of the output light from light emitter 100i can be suppressed.

Output light 7 may have a correlated color temperature higher than or equal to 2,500K but lower than or equal to 7,000K.

Light emitting device 8 that outputs light preferred as illumination light is therefore achieved.

Output light 7 may have average color rendering index Ra greater than or equal to 80 but smaller than or equal to 100.

Light emitting device 8 that outputs light preferred as illumination light is therefore achieved.

In light emitting device 8, output light 7 is outputted from second wavelength converter 5.

Light emitting device 8 can therefore emit output light 7 from second wavelength converter 5.

In light emitting device 8d (or light emitting device 8e), output light 7 is outputted from first wavelength converter 3d.

Therefore, even when second wavelength converter 5d has a highly visible body color, such as red, no discomfort results from the exterior appearance, whereby light emitting device 8d that excels in exterior appearance is achieved.

In light emitting device 8c and other light emitting devices, part of primary light 2 does not pass through first wavelength converter 3c but is applied from radiation source 1 to second wavelength converter 5. For example, the beam diameter of primary light 2 may be greater than the size of first wavelength converter 3c.

As a result, entire first wavelength converter 3c can be irradiated with primary light 2, whereby primary light 2 can be efficiently converted into secondary light 4.

(Others)

The light emitting devices according to the embodiments and the variations thereof have been described above, but the present invention is not limited to the aforementioned embodiments and variations.

For example, in the embodiments and the variations thereof described above, the radiation source may include a laser other than a semiconductor laser. The radiation source may include, for example, a YAG laser or any other solid-state laser, a dye laser or any other liquid laser, or an Ar-ion laser, an He—Cd laser, a nitrogen laser, an excimer laser, or any other gas laser. Any of the light emitting devices may include a plurality of radiation sources.

Any of the light emitting devices may include no radiation source. For example, only the light emitter (first wavelength converter and second wavelength converter) of the light emitting device may form the light emitting device. Further, any of the light emitting devices may include a diffuser plate, a reflection plate, or a support substrate in addition to the components described in the aforementioned embodiments.

The light emitting device according to any of the embodiments described above can be, for example, a lighting apparatus, such as a light source or an illumination system, or a display apparatus, such as a projector.

In addition, a form obtained by changing the embodiments and variations in a variety of manners conceived by a skilled in the art and a form achieved by arbitrarily combining the components and functions in the embodiments to the extent that the combination does not depart from the substance of the present invention fall within the scope of the present invention.

The invention claimed is:

1. A light emitting device comprising:
a radiation source that radiates laser light as primary light;
a first wavelength converter that contains a first phosphor that absorbs at least part of the primary light radiated by the radiation source and converts the primary light absorbed into secondary light; and
a second wavelength converter that contains a second phosphor that absorbs at least part of the secondary light emitted by the first wavelength converter and converts the secondary light absorbed into tertiary light, wherein at least the first phosphor is sealed with an inorganic material,
the light emitting device emits output light containing the primary light, the secondary light, and the tertiary light,
the secondary light contains a larger amount of long-wavelength component than the primary light,
the tertiary light contains a larger amount of long-wavelength component than the secondary light,
a lifetime of fluorescence emitted from the second phosphor is longer than a lifetime of fluorescence emitted from the first phosphor,
light density of the secondary light, with which the second wavelength converter is irradiated, is lower than light density of the primary light, with which the first wavelength converter is irradiated, and
the first wavelength converter is located between the radiation source and the second wavelength converter, and the first wavelength converter is spaced apart from both the radiation source and the second wavelength converter.

2. The light emitting device according to claim 1, wherein the radiation source includes a solid-state light emitting element.

3. The light emitting device according to claim 1, wherein the light density of the secondary light, with which the second wavelength converter is irradiated, is less than or equal to 1/10 of the light density of the primary light, with which the first wavelength converter is irradiated.

4. The light emitting device according to claim 1, wherein the radiation source radiates, as the primary light, blue light having an emission spectrum showing a maximum peak intensity in a region having a wavelength of at least 420 nm and at most 480 nm.

5. The light emitting device according to claim 1, wherein the first phosphor emits, as the secondary light, light having an emission spectrum showing a maximum peak intensity in a region having a wavelength of at least 480 nm and at most 600 nm.

6. The light emitting device according to claim 1, wherein the first phosphor is a $Ce^{3+}$ activated phosphor.

7. The light emitting device according to claim 1, wherein the first phosphor has a garnet crystal structure.

8. The light emitting device according to claim 1, wherein the first phosphor is formed of at least one single crystal.

9. The light emitting device according to claim 1, wherein the second phosphor is an $Eu^{2+}$ activated phosphor.

10. The light emitting device according to claim 1, wherein the second phosphor emits, as the tertiary light, light having an emission spectrum showing a maximum peak intensity in a region having a wavelength of at least 600 nm and at most 660 nm.

11. The light emitting device according to claim 1, wherein the second phosphor is a nitride phosphor or an oxynitride phosphor.

12. The light emitting device according to claim 11, wherein the second phosphor is a compound having the same crystal structure as a crystal structure of $CaAlSiN_3$.

13. The light emitting device according to claim 1, further comprising:
an optical waveguide at least between the radiation source and the first wavelength converter or between the first wavelength converter and the second wavelength converter,
wherein at least one of the primary light, the secondary light, and the tertiary light is guided through the optical waveguide.

14. The light emitting device according to claim 1, wherein the first wavelength converter is positioned between the radiation source and the second wavelength converter.

15. The light emitting device according to claim 1, wherein the first wavelength converter has a light incident surface on which the primary light radiated by the radiation source is incident and a light exiting surface that is opposite to the light incident surface, and
the second wavelength converter partially covers the light exiting surface of the first wavelength converter.

16. The light emitting device according to claim 15, wherein the light exiting surface of the first wavelength converter is partially covered with the second wavelength converter, the second wavelength converter being formed on the light exiting surface to form stripes, a lattice, or dots.

17. The light emitting device according to claim 1, further comprising
an optical waveguide between the first wavelength converter and the second wavelength converter.

18. A light emitting device comprising:
a radiation source that radiates laser light as primary light;
a first wavelength converter that contains a first phosphor that absorbs at least part of the primary light radiated by the radiation source and converts the primary light absorbed into secondary light; and
a second wavelength converter that contains a second phosphor that absorbs at least part of the secondary light emitted by the first wavelength converter and converts the secondary light absorbed into tertiary light,
wherein the light emitting device emits output light containing the primary light, the secondary light, and the tertiary light,
the secondary light contains a larger amount of long-wavelength component than the primary light,
the tertiary light contains a larger amount of long-wavelength component than the secondary light,
a lifetime of fluorescence emitted from the second phosphor is longer than a lifetime of fluorescence emitted from the first phosphor,
light density of the secondary light, with which the second wavelength converter is irradiated, is lower than light density of the primary light, with which the first wavelength converter is irradiated,
the first wavelength converter is formed only of the first phosphor, and
the first phosphor is formed of a single particle having a polyhedral particle shape derived from a garnet crystal structure.

19. A light emitting device comprising:
a first wavelength converter that contains a first phosphor that (i) absorbs at least part of primary light radiated by a radiation source that radiates laser light as the primary light and (ii) converts the primary light absorbed into secondary light; and
a second wavelength converter that contains a second phosphor that absorbs at least part of the secondary light emitted by the first wavelength converter and converts the secondary light absorbed into tertiary light,
wherein at least the first phosphor is sealed with an inorganic material, the light emitting device emits output light containing the primary light, the secondary light, and the tertiary light, the secondary light contains a larger amount of long-wavelength component than the primary light, the tertiary light contains a larger amount of long-wavelength component than the secondary light, a lifetime of fluorescence emitted from the second phosphor is longer than a lifetime of fluorescence emitted from the first phosphor, light density of the secondary light, with which the second wavelength converter is irradiated, is lower than light density of the primary light, with which the first wavelength converter is irradiated and the first wavelength converter is located between the radiation source and the second wavelength converter, and the first wavelength converter is spaced apart from both the radiation source and the second wavelength converter.

* * * * *